United States Patent
Nakane

(10) Patent No.: US 8,111,032 B2
(45) Date of Patent: Feb. 7, 2012

(54) INDICATING INSTRUMENT FOR VEHICLE

(75) Inventor: Hideyuki Nakane, Nishio (JP)

(73) Assignee: Denso Corporation, Kariya (JP)

( * ) Notice: Subject to any disclaimer, the term of this patent is extended or adjusted under 35 U.S.C. 154(b) by 170 days.

(21) Appl. No.: 12/658,219

(22) Filed: Feb. 4, 2010

(65) Prior Publication Data

US 2010/0192836 A1    Aug. 5, 2010

(30) Foreign Application Priority Data

Feb. 5, 2009   (JP) ................................. 2009-025213
Feb. 5, 2009   (JP) ................................. 2009-025214

(51) Int. Cl.
*H02P 8/00*       (2006.01)
*H02K 37/12*      (2006.01)
*G01R 1/20*       (2006.01)

(52) U.S. Cl. ....... 318/685; 318/696; 318/463; 116/62.1; 116/288; 324/163; 324/166; 702/96; 702/142; 73/1.37; 73/1.88

(58) Field of Classification Search .................. 318/599, 318/685, 696, 603, 463; 116/62.1, 47, 284–288, 116/297, DIG. 6, DIG. 36, DIG. 35; 324/139, 324/143, 144, 151 R, 163, 166; 702/142, 702/145, 96; 73/1.37, 1.88, 488

See application file for complete search history.

(56) References Cited

U.S. PATENT DOCUMENTS

| | | | | |
|---|---|---|---|---|
| 3,667,042 A * | 5/1972 | Engel et al. | ................... | 324/174 |
| 4,878,453 A * | 11/1989 | Inoue et al. | ................... | 116/288 |
| 5,032,781 A * | 7/1991 | Kronenberg | ................... | 318/696 |
| 5,353,735 A * | 10/1994 | Arai et al. | ................... | 116/286 |
| 5,723,964 A * | 3/1998 | Nakaba | ................... | 318/599 |
| 5,877,694 A * | 3/1999 | Kataoka | ................... | 340/688 |
| 6,014,075 A * | 1/2000 | Fujimori et al. | ................... | 340/461 |
| 6,067,492 A * | 5/2000 | Tabata et al. | ................... | 701/51 |
| 6,302,551 B1 * | 10/2001 | Matumoto | ................... | 362/27 |
| 6,520,108 B1 * | 2/2003 | Komura | ................... | 116/284 |
| 6,624,608 B2 | 9/2003 | Komura | | |
| 6,677,723 B2 * | 1/2004 | Shimazaki | ................... | 318/696 |
| 6,680,597 B1 * | 1/2004 | Catellani et al. | ................... | 318/696 |
| 6,940,269 B2 * | 9/2005 | Komura | ................... | 324/146 |
| 6,956,351 B2 * | 10/2005 | Yamada | ................... | 318/685 |

(Continued)

FOREIGN PATENT DOCUMENTS

JP        2003-125599        4/2003

(Continued)

*Primary Examiner* — Eduardo Colon Santana

(74) *Attorney, Agent, or Firm* — Harness, Dickey & Pierce, PLC

(57) ABSTRACT

An indicating instrument for a vehicle includes a step motor including a field winding, a pointer, a stopper device for stopping the pointer, which is rotating in a zero-reset direction, at a stopper position, a detecting device for detecting induced voltage of the field winding at each of detecting points, a control device for performing zero-reset control, whereby a drive signal is controlled to rotate the pointer in the zero-reset direction. In a state of abnormal detection in which the induced voltage larger than a predetermined set value is detected at a zero point; and the induced voltage equal to or smaller than the set value is detected at a next detecting point to the zero point, the control device assumes synchronization loss of the step motor and continues the zero-reset control until an assumptive electrical angle corresponding to a rotational position of the pointer reaches the zero point.

8 Claims, 12 Drawing Sheets

U.S. PATENT DOCUMENTS

| | | | |
|---|---|---|---|
| 7,034,495 B2 * | 4/2006 | Sasaki | 318/685 |
| 7,075,290 B2 * | 7/2006 | Collier-Hallman et al. | 324/163 |
| 7,145,309 B2 * | 12/2006 | Reiter et al. | 318/696 |
| 7,233,255 B2 * | 6/2007 | Baba | 340/688 |
| 7,859,216 B2 * | 12/2010 | Yamada | 318/696 |
| 2002/0041170 A1 * | 4/2002 | Shimazaki | 318/696 |
| 2003/0117100 A1 * | 6/2003 | Pigott et al. | 318/685 |
| 2009/0066278 A1 * | 3/2009 | Arisawa | 318/400.35 |
| 2009/0174358 A1 * | 7/2009 | Russ | 318/685 |
| 2010/0192836 A1 * | 8/2010 | Nakane | 116/297 |
| 2010/0242570 A1 * | 9/2010 | Nakane | 73/1.75 |
| 2011/0100290 A1 * | 5/2011 | Nakane et al. | 116/286 |

FOREIGN PATENT DOCUMENTS

JP    2009261045 A  * 11/2009

* cited by examiner

INDICATING INSTRUMENT FOR VEHICLE

CROSS REFERENCE TO RELATED APPLICATION

This application is based on and incorporates herein by reference Japanese Patent Application No. 2009-25213 filed on Feb. 5, 2009, and Japanese Patent Application No. 2009-25214 filed on Feb. 5, 2009.

BACKGROUND OF THE INVENTION

1. Field of the Invention

The present invention relates to an indicating instrument for a vehicle.

2. Description of Related Art

Conventionally, an indicating instrument for a vehicle that rotates a pointer in synchronization with a step motor is known. The pointer indicates a vehicle state value, which is displayed with a zero value as its reference, in accordance with a rotational position of the pointer. The indicating instrument for a vehicle is described in Japanese Patent No. 3770095 (corresponding to U.S. Pat. No. 6,624,608B2), for example. This indicating instrument rotates a pointer through the application of a drive signal of an alternating current, which alternates in accordance with an electrical angle, to a field winding of a step motor.

In the indicating instrument for a vehicle according to Japanese Patent No. 3770095, the pointer that is rotated in a zero-reset direction, which is a direction to return the pointer back to a position of a zero value, is stopped at a stopper position by a stopper mechanism. While the pointer is rotating in the zero-reset direction, an induced voltage is generated in the field winding of the step motor. When the pointer stops, the induced voltage decreases. Accordingly, the induced voltage generated in the field winding is detected, and if the detected voltage is equal to or smaller than a set value, it is determined that the pointer has stopped at the stopper position, and an electrical angle that corresponds to this stopper position is updated. As a result, even if the step motor loses synchronization due to disturbance such as vibration prior to start up of the instrument, so that a rotational position of the pointer is misplaced, the rotation of the pointer is controlled based on the updated electrical angle.

In the indicating instrument for a vehicle of Japanese Patent No. 3770095, the induced voltage is detected for each electrical angle where a voltage of one of the drive signals applied to the field windings in the shape of a cosine function and in the shape of a sine function is zero, i.e., at a zero point and electrical angles whose phases are shifted from the zero point by every 90 degrees. For this reason, a certain error may be observed in the electrical angle updated based on the detected voltage of the induced voltage, in a phase range within less than 90 degrees in a direction corresponding to the zero-reset direction, relative to an electrical angle that corresponds to an actual stopper position.

Furthermore, in the indicating instrument for a vehicle of Japanese Patent No. 3770095, even though the pointer has rotated to the stopper position, a speed of the pointer does not immediately decrease due to such as its elastic deformation. Therefore, the detected voltage of the induced voltage does not become equal to or smaller than the set value, so that the electrical angle may be advanced to the next detecting point whose phase is further shifted by 90 degrees. In such an abnormal state, the step motor loses synchronization when the electrical angle advances to a point whose phase is shifted by 180 degrees from the electrical angle that corresponds to the actual stopper position because of the above-described error of the updated electrical angle or vibration at the stopper position, for example, or when the phase is shifted by 180 degrees from the electrical angle that corresponds to the actual stopper position as a result of a flip-up of the step motor from a stopper. Due to this loss of synchronization of the step motor, the pointer rotates to a position that corresponds to an electrical angle whose phase is shifted by 360 degrees from a actual electrical angle. Accordingly, it is difficult to accurately control the rotation of the pointer after the loss of synchronization by the drive signal that corresponds to the electrical angle in the indicating instrument for a vehicle of Japanese Patent No. 3770095.

SUMMARY OF THE INVENTION

The present invention addresses at least one of the above disadvantages.

According to the present invention, there is provided an indicating instrument for a vehicle including a step motor, a pointer, a stopper device, a detecting device, and a control device. The step motor includes a field winding and is rotated upon application of a drive signal to the field winding. The drive signal is an alternating current that alternates in accordance with an electrical angle. The pointer is rotatable in synchronization with the step motor. The pointer points to a vehicle state value, which is indicated with a zero value as a reference thereof, in accordance with a rotational position of the pointer. The pointer is rotatable in a zero-reset direction to return to a zero position that indicates the zero value. The stopper device is for stopping the pointer, which is rotating in the zero-reset direction, at a stopper position that is located within a predetermined range from the zero position in the zero-reset direction. The detecting device is for detecting an induced voltage generated in the field winding at each of a plurality of detecting points, which are electrical angles at intervals of 90 degrees and include a zero point that corresponds to the stopper position. The control device is for performing zero-reset control, whereby the control device controls the drive signal so as to rotate the pointer in the zero-reset direction. In a state of abnormal detection in which: the detecting device detects the induced voltage that is larger than a predetermined set value at the zero point; and the detecting device detects the induced voltage that is equal to or smaller than the set value at a next detecting point to the zero point, the control device assumes loss of synchronization of the step motor and continues the zero-reset control until an assumptive electrical angle that corresponds to a rotational position of the pointer reaches the zero point.

According to the present invention, there is also provided an indicating instrument for a vehicle including a step motor, a pointer, a stopper device, a detecting device, and a control device. The step motor includes a field winding and is rotated upon application of a drive signal to the field winding. The drive signal is an alternating current that alternates in accordance with an electrical angle. The pointer is rotatable in synchronization with the step motor. The pointer points to a vehicle state value, which is indicated with a zero value as a reference thereof, in accordance with a rotational position of the pointer. The pointer is rotatable in a zero-reset direction to return to a zero position that indicates the zero value. The stopper device is for stopping the pointer, which is rotating in the zero-reset direction, at a stopper position that is located within a predetermined range from the zero position in the zero-reset direction. The detecting device is for detecting an induced voltage generated in the field winding at each of a plurality of detecting points, which are electrical angles at intervals of 90 degrees and include a zero point that corresponds to the stopper position. The control device is for performing zero-reset control, whereby the control device controls the drive signal so as to rotate the pointer in the zero-reset direction. In a state of abnormal detection in which the detecting device detects the induced voltage that is larger than a predetermined set value at the zero point; and the detecting device detects the induced voltage that is equal to or smaller than the set value at a next detecting point to the zero point, the control device switches from the zero-reset control to reversal control, whereby the control device reverses a rotation direction of the pointer from the zero-reset direction, by controlling the drive signal to the zero point.

BRIEF DESCRIPTION OF THE DRAWINGS

The invention, together with additional objectives, features and advantages thereof, will be best understood from the following description, the appended claims and the accompanying drawings in which:

DETAILED DESCRIPTION OF THE INVENTION

First Embodiment

A first embodiment of the invention will be described below with reference to the accompanying drawings. An indicating instrument 1 for a vehicle is disposed in front of a driver seat inside the vehicle as a vehicle speed meter.

Figure 1:
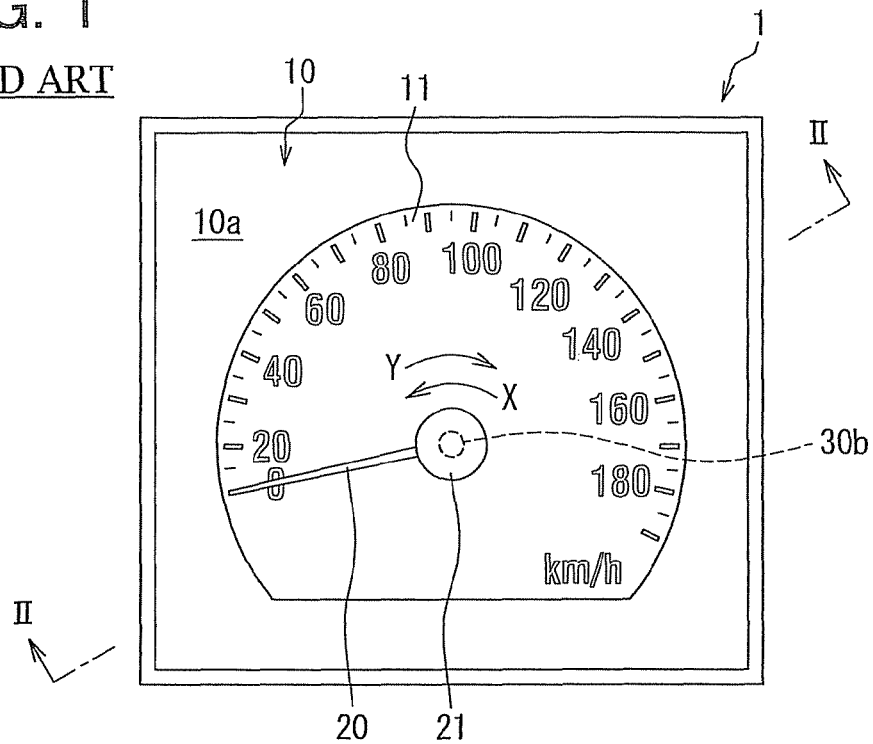
FIG. 1 is a front view illustrating an indicating instrument for a vehicle according to first and second embodiments of the invention.
Figure 2:
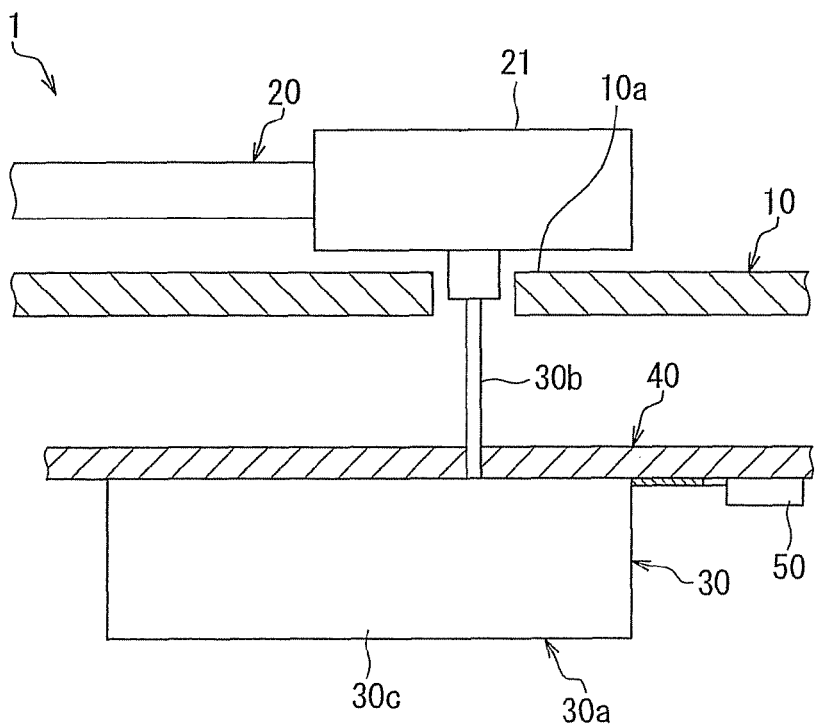
FIG. 2 is a vertical cross-sectional view taken along a line II-II in FIG. 1.
Figure 3:
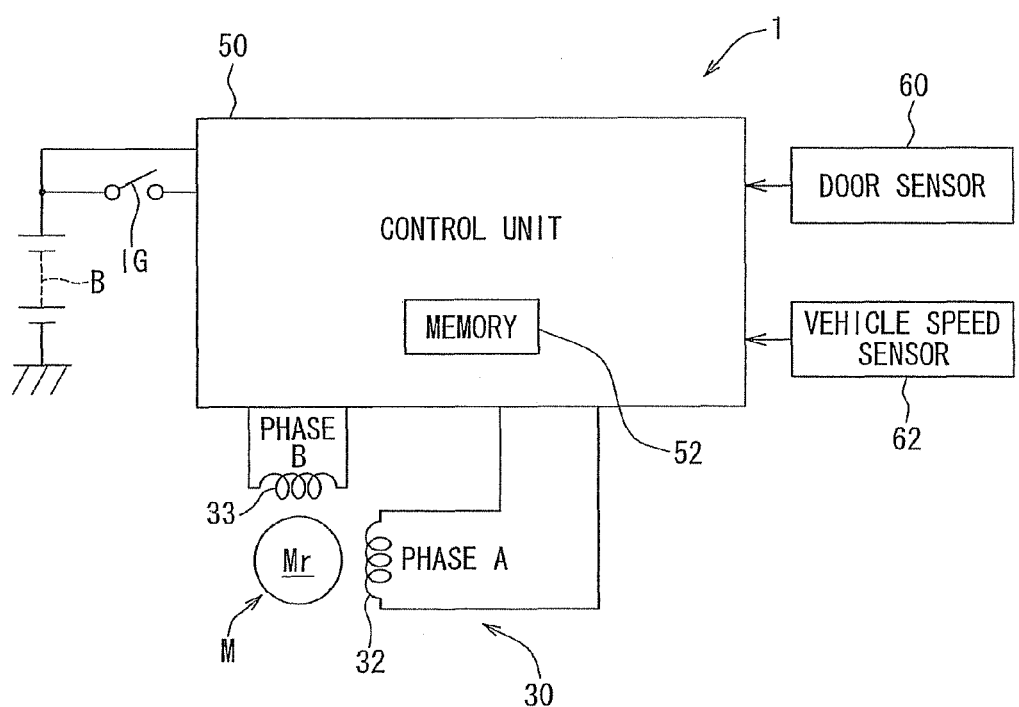
FIG. 3 is a block diagram illustrating an electrical circuit configuration of the indicating instrument according to the first and second embodiments.

A structure of the indicating instrument 1 will be described in detail below. As illustrated in FIGS. 1 to 3, the indicating instrument 1 includes an instrument board 10, a pointer 20, a rotating inner device 30, a board 40, and a control unit 50. The control unit 50 may serve as a "detecting device" or a "control device."

The instrument board 10 illustrated in FIGS. 1 and 2 is disposed with its display surface 10a directed toward the driver seat, and includes a vehicle speed display 11 that displays a vehicle speed value as a vehicle state value. The vehicle speed display 11 displays vehicle speed values in a shape of a circular arc from a zero value (0 km/h), which serves as their reference value, to an upper limit (180 km/h).

The pointer 20 is coupled to a pointer shaft 30b of the rotating inner device 30 on its base end portion 21 side, and rotatable in a zero-reset direction X and in a speed increasing direction Y (see FIG. 1), along the display surface 10a of the instrument board 10. Accordingly, the pointer 20, which indicates a vehicle speed value in accordance with a rotational position among those displayed on the vehicle speed display 11, is returnable back to a zero position that indicates the zero value, by its rotation in the zero-reset direction X as illustrated in FIG. 1.

As illustrated in FIG. 2, the rotating inner device 30 includes a main body 30a of the inner device, the pointer shaft 30b, and a casing 30c. The main body 30a is disposed on a back surface side of the board 40 which is generally parallel to the instrument board 10. The main body 30a includes a two-phase step motor M, a reduction gear mechanism G, and a stopper mechanism S that may serve as a "stopper device" (see FIG. 4), which are incorporated into the casing 30c. The pointer shaft 30b is supported by the casing 30c, which is fixed on the back surface of the board 40, and passes through the board 40 and the instrument board 10 to hold the base end portion 21 of the pointer 20. Accordingly, the main body 30a may rotate the pointer shaft 30b, which is coaxial with an output stage gear 34 of the reduction gear mechanism G, and eventually, the pointer 20 by deceleration rotation of the reduction gear mechanism G that is in synchronization with rotation of the step motor M.

Figure 4:
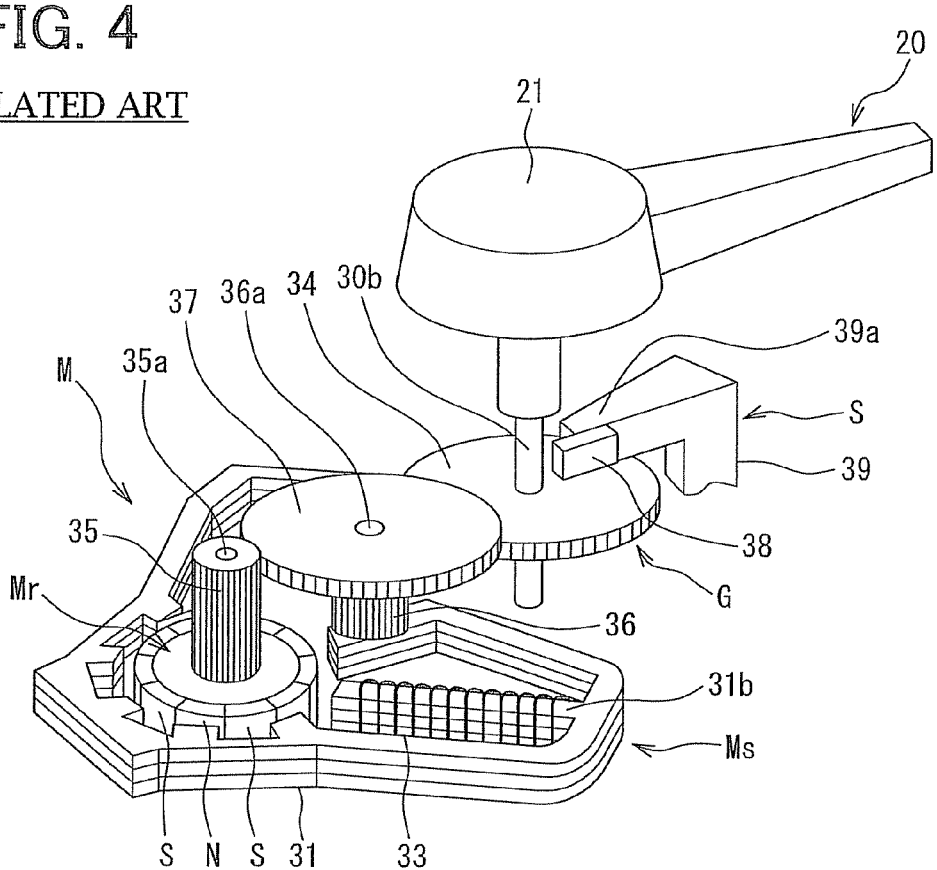
FIG. 4 is a perspective view illustrating a main feature of the indicating instrument according to the first and second embodiments.
Figure 5:
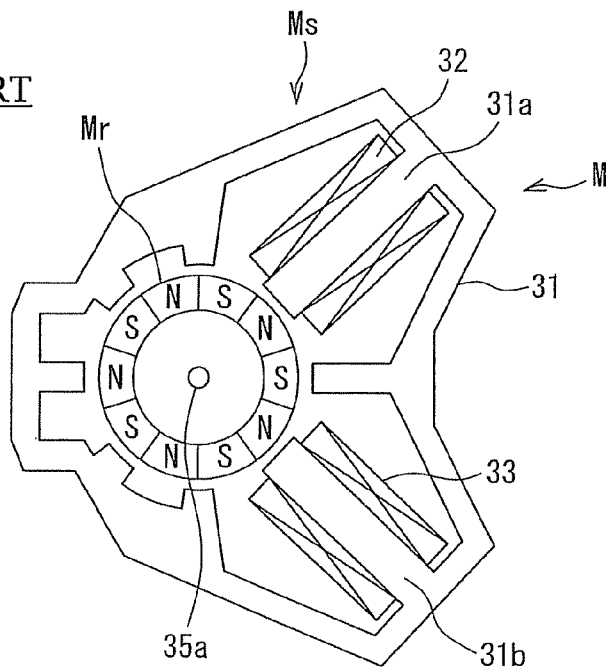
FIG. 5 is a plan view illustrating the main feature of the indicating instrument according to the first and second embodiments.

As illustrated in FIGS. 4 and 5, the step motor M includes a stator Ms and a magnet rotor Mr, which are combined together. The stator Ms has a yoke 31 and two field windings 32, 33. The yoke 31 includes a pair of magnetic poles 31a, 31b having a shape of a pole, and an A-phase field winding 32 is wound around the magnetic pole 31a, whereas a B-phase field winding 33 is wound around the magnetic pole 31b. The magnet rotor Mr is fixed to a rotatable shaft 35a of the reduction gear mechanism G coaxially with the rotatable shaft 35a. Clearances are formed between an outer peripheral surface of the magnet rotor Mr and front end surfaces of the magnetic poles 31a, 31b of the yoke 31, and a north pole and a south pole serving as magnetic poles are formed alternately on the outer peripheral surface of the magnet rotor Mr in a rotational direction of the rotor Mr.

In the step motor M having the above-described structure, an A-phase drive signal of such an alternating current that voltage alternates in the shape of a cosine function in accordance with the electrical angle (see FIG. 6) is applied to the A-phase field winding 32. On the other hand, a B-phase drive signal of such an alternating current that the voltage alternates in the shape of a sine function in accordance with the electrical angle (see FIG. 6) is applied to the B-phase field winding 33. As above, the A-phase and B-phase drive signals are out of phase with each other by 90 degrees. Consequently, alternate current (AC) magnetic fluxes are generated in the field windings 32, 33, to which such A-phase and B-phase drive signals are respectively applied. The AC magnetic fluxes pass between the yoke 31 and the magnetic poles of the magnet rotor Mr. Accordingly, the magnet rotor Mr rotates in accordance with voltage changes of the A-phase and B-phase drive signals, which are associated with the electrical angle.

As illustrated in FIG. 4, the reduction gear mechanism G includes an output stage gear 34, an input stage gear 35, and intermediate gears 36, 37. The output stage gear 34 is coupled to the pointer shaft 30b coaxially with the shaft 30b. The input stage gear 35 is supported by the rotatable shaft 35a that is fixed to the casing 30c coaxially with the shaft 35a. The intermediate gears 36, 37 are supported by a rotatable shaft 36a, which is fixed to the casing 30c, coaxially with the shaft 36a, so that the gears 36, 37 are made integrally rotatable. The intermediate gear 36 is engaged with the output stage gear 34, whereas the intermediate gear 37 is engaged with the input stage gear 35.

Figure 6:
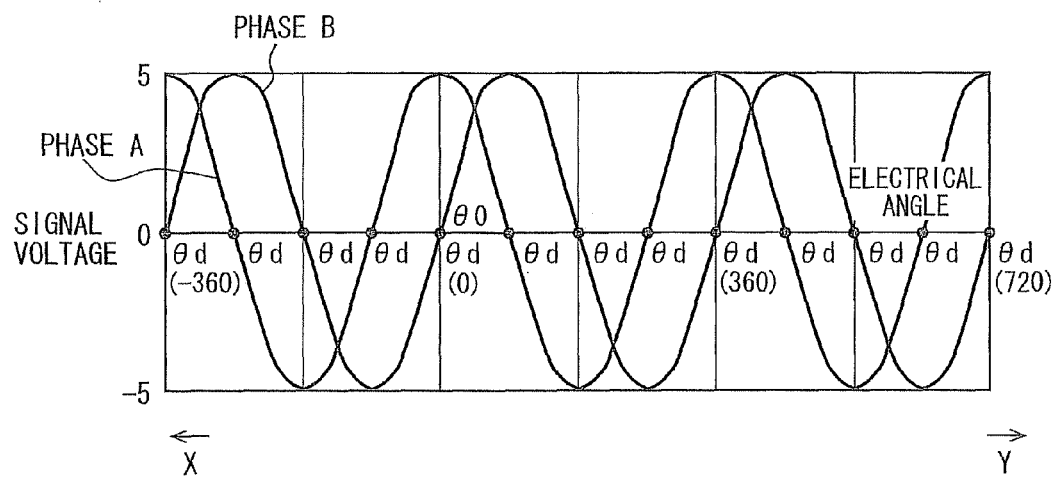
FIG. 6 is a characteristic diagram illustrating a drive signal of the indicating instrument according to the first and second embodiments.

Because of the above-described structure of the reduction gear mechanism G, the mechanism G reduces speed of rotation of the magnet rotor Mr of the step motor M, which is connected to the input stage gear 35, so as to transmit the decelerated rotation to the pointer 20, which is connected to the output stage gear 34. Therefore, as the A-phase and B-phase drive signals change in accordance with the electrical angle, a rotational position of the magnet rotor Mr changes, so that a rotational position of the pointer 20 also changes. In addition, as illustrated in FIG. 6, in the present embodiment, a direction in which the electrical angle decreases corresponds to the zero-reset direction X of the pointer 20, and a direction in which the electrical angle increases corresponds to the speed increasing direction Y of the pointer 20.

Figure 7:
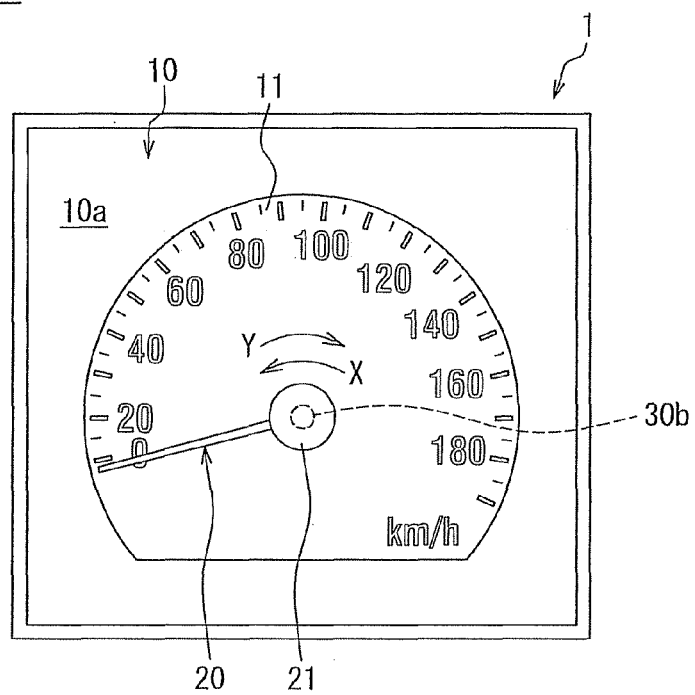
FIG. 7 is a front view illustrating an operating state of the indicating instrument according to the first and second embodiments, which is different from an operating state illustrated in FIG. 1.

As illustrated in FIG. 4, the stopper mechanism S includes a contact member 38 and a stopper member 39. The contact member 38 is formed in the shape of a thin strip of a plate that projects from the output stage gear 34, and rotatable integrally with the gear 34. The stopper member 39 is formed so as to have an L-shaped structure that projects from the casing 30c inward of the casing 30c. Along a rotating track of the contact member 38, a front end portion 39a of the stopper member 39 on its projection side is located further in a direction corresponding to the zero-reset direction X than the contact member 38. Thus, when the contact member 38 is engaged with the front end portion 39a of the stopper member 39 as a result of the rotation of the pointer 20 in the zero-reset direction X, the pointer 20 stops at a stopper position within a predetermined range from the zero position in the zero-reset direction X, as illustrated in FIG. 7. Accordingly, particularly in the step motor M of the present embodiment, a zero point θ0 (zero degree) of the electrical angle is updated to the electrical angle that corresponds to the stopper position by initial processing, which is described in greater detail hereinafter. The stopper position is set at the time of production of the instrument 1, for instance, within a range of 450 degrees in terms of the electrical angle of the step motor M from the zero position of the pointer 20 in the direction corresponding to the zero-reset direction X.

As illustrated in FIG. 2, the control unit 50 is configured to mainly include a microcomputer, and mounted on the board 40. The control unit 50 includes a memory 52 illustrated in FIG. 3 that may serve as a "storing device." The latest zero point θ0 as a result of the update by the initial processing is continually stored in the memory 52. An execution program for performing various processings including the initial processing and normal processing (described in greater detail hereinafter), and a predetermined phase interval ΔP are stored in advance in the memory 52. The phase interval ΔP is a value calculated beforehand as a difference between the electrical angle of the step motor M corresponding to the zero position of the pointer 20, and the zero point θ0 (electrical angle) that is initialized corresponding to the stopper position of the pointer 20 (see FIG. 7) at the time of factory shipments, for example.

The control unit 50 is electrically connected to a door sensor 60 of the vehicle, an ignition switch IG, and a battery power source B. The control unit 50 is started by a direct electric supply from the battery power source B when opening of a door of the vehicle is detected by the door sensor 60. If the ignition switch IG is turned on before a set period (e.g., two minutes) elapses, the control unit 50 that has been started maintains an operating state by the electric supply from the battery power source B. After that, the operation of the control unit 50 is stopped as a result of turning off of the ignition switch IG. The control unit 50 that has been started stops its operation temporarily if the ignition switch IG is not turned on before the set period elapses. When the ignition switch IG is turned on after that, the control unit 50 is restarted. The control unit 50 stops its operation as a result of the turning off of the ignition switch IG. The restart of the control unit 50 is carried out in response to turning on of the ignition switch IG. Alternatively, the control unit 50 may be restarted in response to, for example, the opening of the door of the vehicle or depression of a brake pedal of the vehicle.

As illustrated in FIG. 3, the control unit 50 is electrically connected to the field windings 32, 33 of the step motor M. In the initial processing, the control unit 50 detects induced voltage that is generated in the field windings 32, 33, controlling the A-phase and B-phase drive signals which are applied to the field windings 32, 33.

More specifically, at the electrical angle where signal voltages of the A-phase and B-phase drive signals are larger than zero (0V), a route to apply the signals to corresponding field windings 32, 33 is electrically connected to the control unit 50, and a route to detect the induced voltage generated in the corresponding windings is closed, by a switching function. At the electrical angle where the signal voltages of the A-phase and B-phase drive signals are zero, the route to apply the signals to the corresponding field windings 32, 33 is closed, and the route to detect the induced voltage generated in the corresponding windings is electrically connected to the control unit 50, by the switching function. Accordingly, in the present embodiment, in which the A-phase and B-phase drive signals alternate in the shape of the cosine function and in the shape of the sine function in accordance with the electrical angle, the electrical angle where the signal voltages are zero, i.e., the zero point θ0 and the electrical angles whose phases are shifted from the zero point θ0 at intervals of 90 degrees (indicated by black dots in FIG. 6), are set at detecting points θd of the induced voltage. In addition, as for the above-described switching function of the control unit 50, the connection and cutoff of the route may be carried out at every detecting point θd, for example, by the switching processing in the microcomputer that constitutes the control unit 50, or the connection and cutoff of the route may be carried out at every detecting point θd by switching between input and output ports of the microcomputer.

As illustrated in FIG. 3, the control unit 50 is electrically connected to a vehicle speed sensor 62. In the normal processing after the initial processing, the control unit 50 makes the pointer 20 indicate a vehicle speed value detected by the speed sensor 62 by controlling the A-phase and B-phase drive signals based on the zero point θ0 of the electrical angle. Here, with respect to the zero point θ0, the latest zero point θ0 that is updated by the last initial processing and stored in the memory 52 is employed.

Figure 8:
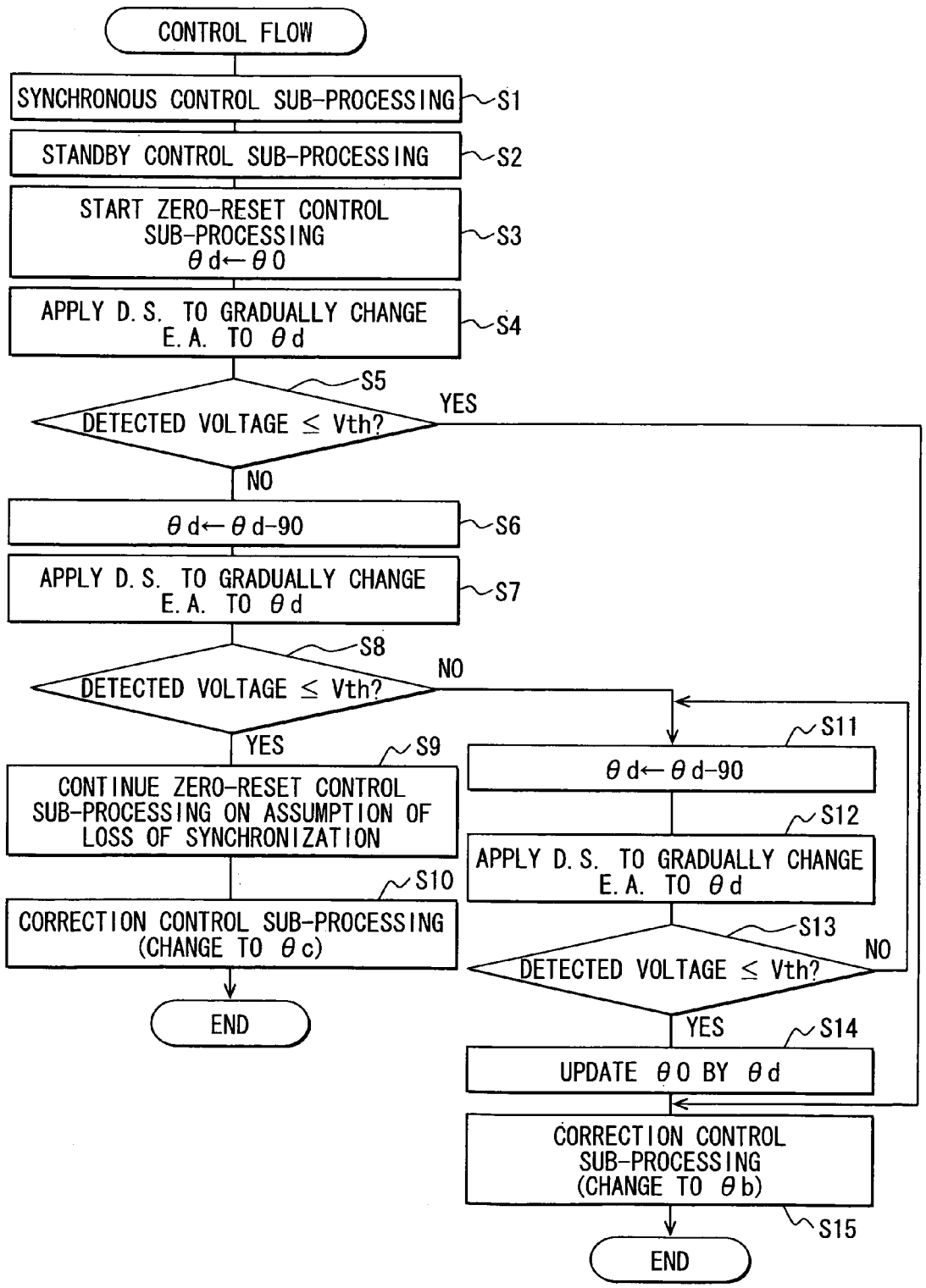
FIG. 8 is a flow chart illustrating a control flow of the indicating instrument according to the first embodiment.

A control flow for performing the initial processing by the control unit 50 in accordance with the first embodiment will be described in detail below with reference to FIG. 8. This control flow is started upon the start of the control unit 50.

At S1 of the control flow, synchronous control sub-processing is performed. More specifically, in the synchronous control sub-processing, the zero point θ0 and the phase interval ΔP that are stored in the memory 52 are first retrieved. Next, the electrical angle that is shifted from the zero point θ0 in the direction corresponding to the speed increasing direction Y by the phase interval ΔP, i.e., the electrical angle corresponding to the zero position of the pointer 20, is set at a reference point θb. Then, as the A-phase and B-phase drive signals, signals corresponding to the reference point θb are applied to the A-phase and B-phase field windings 32, 33. Furthermore, signals for synchronizing the magnetic poles of the magnet rotor Mr and the electrical angle by the rotation of the pointer 20 in the zero-reset direction X are applied to the A-phase and B-phase field windings 32, 33, as the A-phase and B-phase drive signals. Lastly, as the A-phase and B-phase drive signals, signals for returning the electrical angle back to the reference point θb are applied to the A-phase and B-phase field windings 32, 33.

At S2 that follows S1, standby control sub-processing is performed. More specifically, in the standby control sub-processing, signals for making the pointer 20 stand by at a predetermined starting point θs after gradual change of the electrical angle from the reference point θb, which is set by the synchronous control sub-processing at S1, to the starting point θs, are applied to the A-phase and B-phase field windings 32, 33 as the A-phase and B-phase drive signals. The starting point θs may be set at such a small value as to limit unattractiveness of the indicating instrument 1 because of upward swing and downward swing of the pointer 20 in the standby control sub-processing, and furthermore, at such a large value as to detect the induced voltage in zero-reset control sub-processing, which is described in greater detail hereinafter. For these reasons, in the present embodiment, for instance, the starting point θs is set at the electrical angle whose phase is shifted from the zero point θ0 by 273 degrees in the direction corresponding to the speed increasing direction Y.

At S3 that follows, the zero-reset control sub-processing that mainly includes rotation control of the pointer 20 in the zero-reset direction X is started. The zero point θ0, which is stored in the memory 52, is retrieved, and this zero point θ0, which is located further in the direction corresponding to the zero-reset direction X than the starting point θs, is set at the present detecting point θd. At S4, signals for gradually changing the electrical angle to the detecting point θd, which is set at S3, are applied to the A-phase and B-phase field windings 32, 33 as the A-phase and B-phase drive signals. At S5, induced voltage of a detection winding of the A-phase and B-phase field windings 32, 33 whose drive signal has zero of voltage at the present detecting point θd is detected, and whether this detected voltage is equal to or smaller than a set value Vth is determined.

If a negative determination is made at S5 as a result of the detected voltage being larger than the set value Vth, control proceeds to S6. At S6, an electrical angle whose phase is shifted from the detecting point θd, which is set at S3, by 90 degrees in the direction corresponding to the zero-reset direction X, is set at the present detecting point θd. Accordingly, at S6, the next detecting point θd is set at the zero point θ0, which has been set at the detecting point θd at S3. At S7, signals for gradually changing the electrical angle to the detecting point θd, which is set at S6, are applied to the A-phase and B-phase field windings 32, 33 as the A-phase and B-phase drive signals. At S8, according as S5, induced voltage of a detection winding is detected, and whether this detected voltage is equal to or smaller than the set value Vth is determined.

If a positive determination is made as a result of the detected voltage being equal to or smaller than the set value Vth at S8, control proceeds to S9. At S9, regardless of whether the step motor M has actually lost synchronization, control continues the zero-reset control sub-processing on the assumption that the loss of synchronization has been caused. On the assumption that the step motor M has lost synchronization, the rotational position of the pointer 20 that rotates in synchronization with the step motor M corresponds apparently to the electrical angle whose phase is shifted from the detecting point θd, which is set at S6, by 360 degrees in the direction corresponding to the speed increasing direction Y. Accordingly, at S9, the A-phase and B-phase drive signals are applied to the A-phase and B-phase field windings 32, 33 to gradually change the electrical angle to a continuation end point θe whose phase is shifted from the zero point θ0 by 360 degrees in the direction corresponding to the zero-reset direction X, i.e., until the phase is shifted by 270 degrees from the set detecting point θd. As a result, the zero-reset control sub-processing is continued until the apparent electrical angle, which corresponds to the rotational position of the pointer 20 on the assumption of the loss of synchronization of the step motor M, reaches the zero point θ0.

After completion of such continuation of the zero-reset control sub-processing at S9, control proceeds to S10 to perform correction control sub-processing. More specifically, in the correction control sub-processing, the phase interval ΔP that is stored in the memory 52 is first retrieved. Next, the electrical angle that is shifted from the continuation end point θe of the zero-reset control sub-processing by the phase interval ΔP in the direction corresponding to the speed increasing direction Y, i.e., the electrical angle whose phase is shifted from the reference point θb, which is set by the synchronous control sub-processing at S1, by 360 degrees in the direction corresponding to the zero-reset direction X, is set at a correction point θc. Furthermore, the A-phase and B-phase drive signals are applied to the A-phase and B-phase field windings 32, 33 in a manner such that the electrical angle, which is temporarily made larger than this set correction point θc, is gradually changed to the correction point θc. As a consequence, the rotational position of the pointer 20, which has rotated to a position corresponding to the zero point θ0 at the completion of continuation of the zero-reset control sub-processing, is set at the zero position corresponding to the reference point θb. Then, after reading the electrical angle of the reference point θb as the correction point θc, the present initial processing is ended, and the normal processing is started.

Thus far, the case in which the positive determination is made at S8 has been described. If the negative determination is made at S8 as a result of the detected voltage being larger than the set value Vth, control proceeds to S11. At S11, the electrical angle whose phase is shifted from the detecting point θd (that is set at S6 immediately before S11, or at S11, after which control returns to the present step S11 through S13) by 90 degrees in the direction corresponding to the zero-reset direction X, is set at the present detecting point θd. At S12, signals for gradually changing the electrical angle to the detecting point θd, which is set at S11, are applied to the A-phase and B-phase field windings 32, 33 as the A-phase and B-phase drive signals. At S13, according as S5, induced voltage of the detection winding is detected, and whether this detected voltage is equal to or smaller than the set value Vth is determined.

As long as a negative determination is made at S13, control returns to S11, and the procedures at S11 and the following steps S12, S13 are repeated. If a positive determination is made at S13, control proceeds to S14. At S14, it is determined that the detecting point θd, which is set at the immediately preceding step S11, is the present zero point θ0 corresponding to the stopper position of the pointer 20, and accordingly, the zero point θ0, which is stored in the memory 52, is updated by this detecting point θd.

After completion of the above-described execution of the procedure S14, or if the positive determination is made at S5 as a result of the detected voltage being equal to or smaller than the set value Vth, control completes the zero-reset control sub-processing to proceed to S15, at which the correction control sub-processing is performed. In the correction control sub-processing at S15, unlike the correction control sub-processing at S10, the latest zero point θ0, which is stored in the memory 52, is first retrieved, then the reference point θb based on this zero point θ0 is set in accordance with the step S1. Next, the A-phase and B-phase drive signals are applied to the A-phase and B-phase field windings 32, 33 in a manner such that the electrical angle, which is temporarily made larger than this set reference point θb, is gradually changed to the reference point θb. Accordingly, the rotational position of the pointer 20 is set at the zero position corresponding to the reference point θb. Through the above-described procedures, the present initial processing is completed, and the following normal processing is started.

Exemplary operations realized by the above-described initial processing will be described below with reference to FIGS. 9 to 13. In graphs of FIGS. 9 to 13, a continuous line indicates a change of the electrical angle with time, and an alternate long and short dash line indicates a change of the rotational position of the pointer 20 with time using its corresponding temporal change in the electrical angle.

Figure 9:
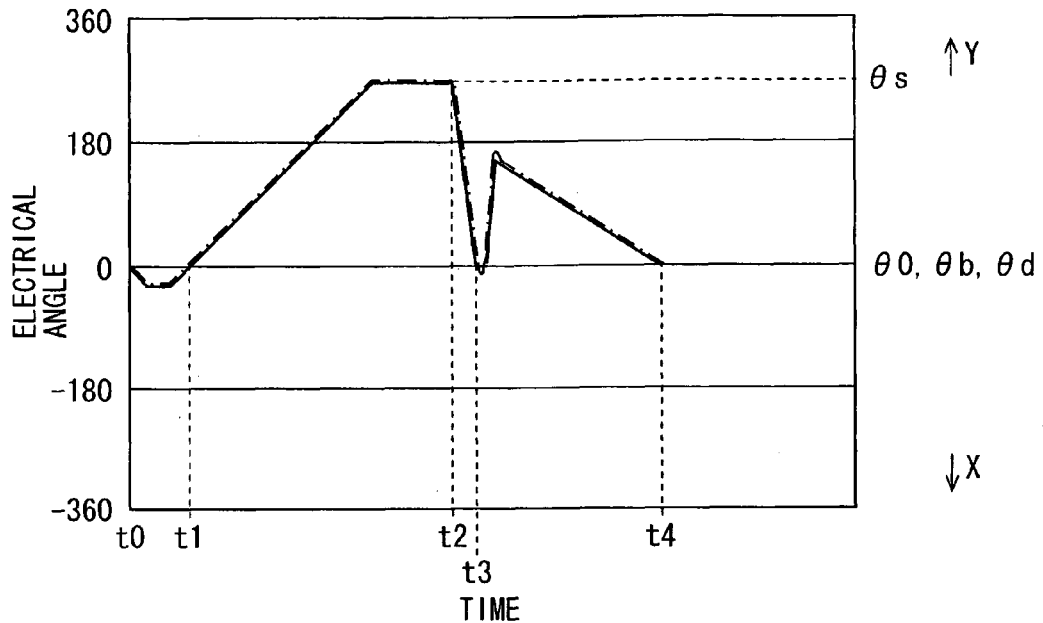
FIG. 9 is a characteristic diagram illustrating a first exemplary operation of the indicating instrument according to the first embodiment.

A first exemplary operation will be explained below. FIG. 9 illustrates an example of normal time when the induced voltage is properly detected at the zero point θ0 under conditions in which the phase interval ΔP between the electrical angle corresponding to the zero position of the pointer 20 and the zero point θ0 corresponding to the stopper position is 0 (zero) degree and in which the pointer 20 is not shifted from the zero position of the pointer 20 before the start of the control unit 50.

When the initial processing is started upon the start of the control unit 50, after the electrical angle changes to the reference point θb, which coincides with the zero point θ0, so that the rotational position of the pointer 20 is set at the zero position, the magnet rotor Mr and the electrical angle are synchronized and the pointer 20 is returned to this zero position (t0 to t1), by the synchronous control sub-processing.

Then, by the standby control sub-processing, the electrical angle changes to the starting point θs whose phase is shifted from the zero point θ0 by 273 degrees in the direction corresponding to the speed increasing direction Y, so that the pointer 20 is swung up to a position corresponding to the starting point θs (t1 to t2).

Next, upon the start of the zero-reset control sub-processing, the electrical angle changes to the first detecting point θd that coincides with the zero point θ0, so that the pointer 20 stops at the stopper position. Accordingly, the detected voltage of the induced voltage of the detection winding 33 is equal to or smaller than the set value Vth at the normal time (t2 to t3).

The correction control sub-processing is started after the above-described procedures. Consequently, the electrical angle temporarily becomes larger than the reference point θb, which coincides with the zero point θ0, and then returns back to this reference point θb. In consequence, the pointer 20 rotates to the zero position, and the initial processing is ended (t3 to t4).

Figure 10:
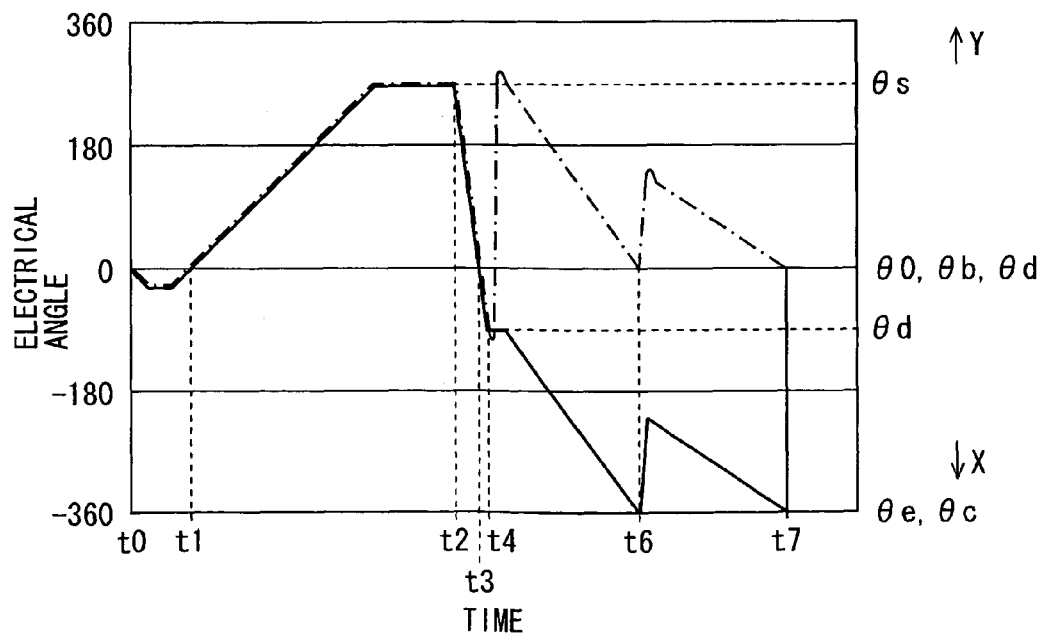
FIG. 10 is a characteristic diagram illustrating a second exemplary operation of the indicating instrument according to the first embodiment.
Figure 11:
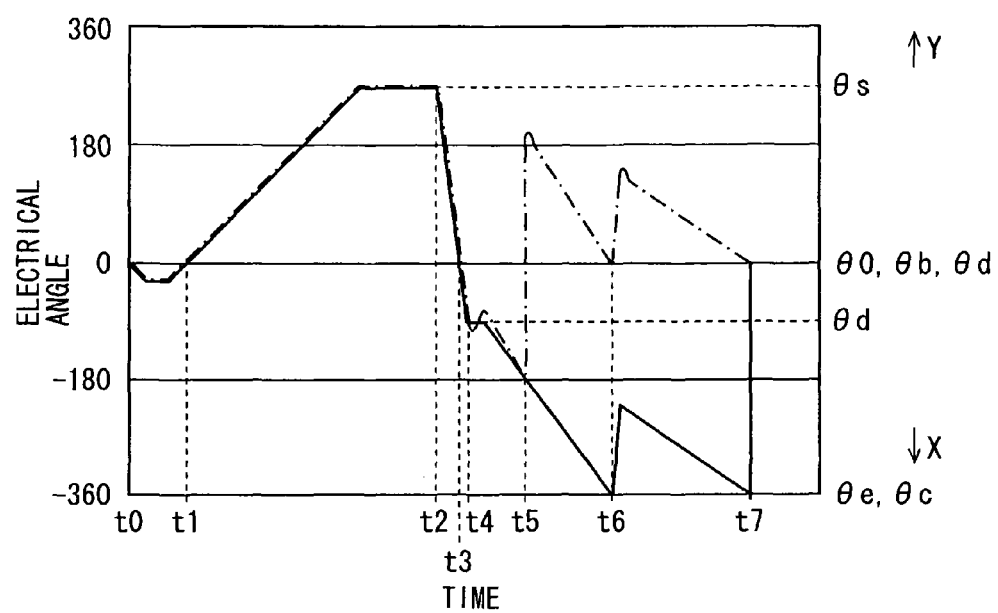
FIG. 11 is a characteristic diagram illustrating the second exemplary operation of the indicating instrument according to the first embodiment.

A second exemplary operation will be explained below. FIGS. 10 and 11 illustrate examples at the time of abnormal detection when the induced voltage is not properly detected at the zero point θ0 under conditions in which the phase interval ΔP is 0 (zero) degree and the pointer 20 is not shifted from the zero position of the pointer 20 before the start of the control unit 50.

When the initial processing is started upon the start of the control unit 50, similar to the first exemplary operation, the synchronous control sub-processing and the standby control sub-processing are performed in this order (t0 to t2).

Next, upon the start of the zero-reset control sub-processing, the electrical angle changes to the first detecting point θd that coincides with the zero point θ0, so that the pointer 20 stops at the stopper position. At the abnormal time, however, the detected voltage of the induced voltage of the detection winding 33 becomes larger than the set value Vth, so that the zero-reset control sub-processing is continued (t2 to t3). As a result, the electrical angle reaches the next detecting point θd whose phase is shifted from the zero point θ0 by 90 degrees in the direction corresponding to the zero-reset direction X. Accordingly, the detected voltage of the induced voltage of the detection winding 32 becomes equal to or smaller than the set value Vth (t3 to t4).

In such a case of the abnormal detection, on the assumption of the loss of synchronization of the step motor M, the zero-reset control sub-processing is continued such that the apparent electrical angle, which corresponds to the rotational position of the pointer 20, coincides with the zero point θ0. Accordingly, the electrical angle changes to the continuation end point θe whose phase is shifted from the zero point θ0 by 360 degrees in the direction corresponding to the zero-reset direction X (t4 to t6). As a result, when the loss of synchronization has actually been caused as illustrated in FIG. 10, the pointer 20 rotates to a position corresponding to the electrical angle whose phase is shifted from the actual electrical angle, which is controlled by the continuation of the zero-reset control sub-processing, by 360 degrees in the direction corresponding to the speed increasing direction Y (t6). On the other hand, when the loss of synchronization actually has not been caused as illustrated in FIG. 11, by the continuation of the zero-reset control sub-processing, the step motor M is forced to lose synchronization. Accordingly, the pointer 20 rotates to a position corresponding to the electrical angle whose phase is shifted from the electrical angle at the time of this forcible synchronization loss by 360 degrees in the direction corresponding to the speed increasing direction Y (t5). Furthermore, by the continuation of the zero-reset control sub-processing after the forcible synchronization loss, the pointer 20 rotates to the position corresponding to the electrical angle whose phase is shifted from the actual controlled electrical angle by 360 degrees in the direction corresponding to the speed increasing direction Y (t6). Therefore, irrespective of whether the step motor M has lost synchronization due to the abnormal detection, the continuation of the zero-reset control sub-processing is ended in a state in which the pointer 20 has rotated to the position corresponding to the zero point θ0 (zero position in the present example).

When the correction control sub-processing is started after the above-described procedures, as illustrated in FIGS. 10 and 11, the electrical angle temporarily becomes larger than the correction point θc, whose phase is shifted by 360 degrees from the reference point θb because the correction point θc coincides with the continuation end point θe based on the zero point θ0, and then the electrical angle returns to this correction point θc. Accordingly, the pointer 20 rotates to the zero position, and the initial processing is ended after the electrical angle of the reference point θb is read as the correction point θc (t6 to t7).

Figure 12:
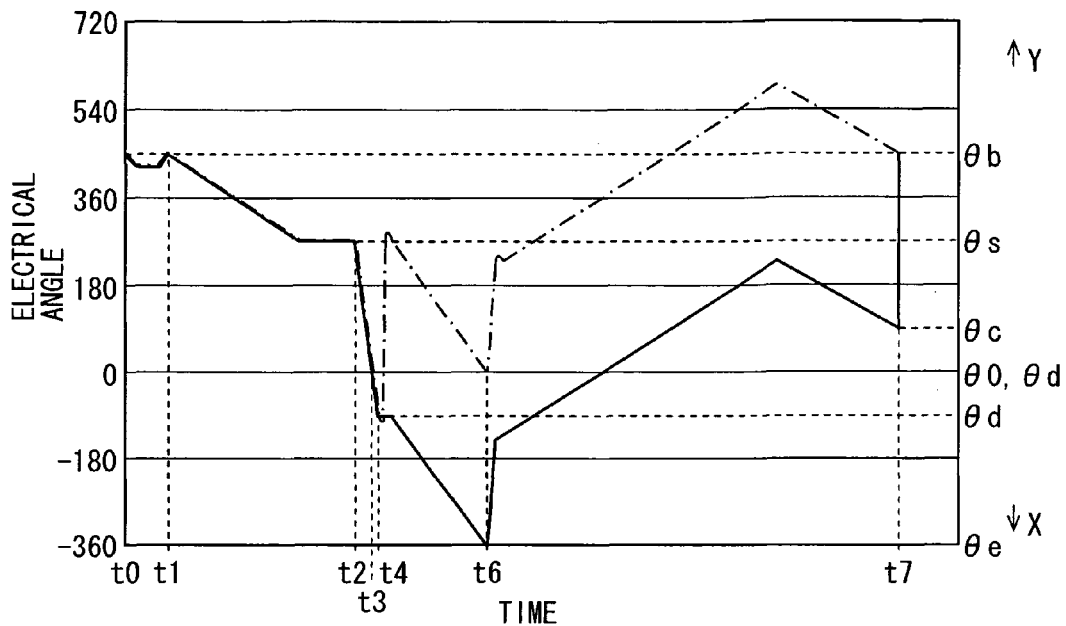
FIG. 12 is a characteristic diagram illustrating a third exemplary operation of the indicating instrument according to the first embodiment.
Figure 13:
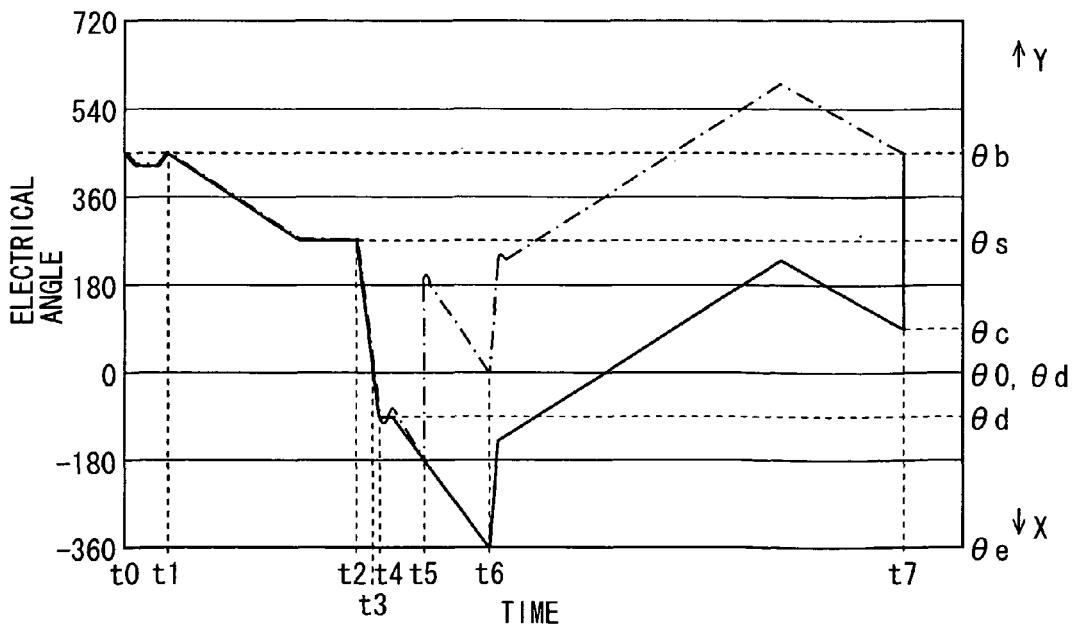
FIG. 13 is a characteristic diagram illustrating the third exemplary operation of the indicating instrument according to the first embodiment.

A third exemplary operation will be explained below. FIGS. 12 and 13 illustrate examples at the time of abnormal detection when the induced voltage is not properly detected at the zero point θ0 under conditions in which the phase interval ΔP is 450 degrees and the pointer 20 is not shifted from the zero position of the pointer 20 before the start of the control unit 50.

When the initial processing is started upon the start of the control unit 50, by the synchronous control sub-processing, the electrical angle changes to the reference point θb whose phase is shifted from the zero point θ0 by 450 degrees in the direction corresponding to the speed increasing direction Y, so that the rotational position of the pointer 20 is set at the zero position. After that, the magnet rotor Mr and the electrical angle are synchronized and the pointer 20 is returned to this zero position (t0 to t1). Then, by the standby control sub-processing, the electrical angle changes to the starting point θs whose phase is shifted from the zero point θ0 by 273 degrees in the direction corresponding to the speed increasing direction Y, so that the pointer 20 is swung down to the position corresponding to the starting point θs (t1 to t2).

Next, similar to the second exemplary operation, the zero-reset control sub-processing is continued to the next detecting point θd of the zero point θ0 because of the abnormality. The detected voltage of the induced voltage of the detection winding 32 becomes equal to or smaller than the set value Vth at the above next detecting point θd (t2 to t4). In this case as well, similar to the second exemplary operation, by the continuation of the zero-reset control sub-processing such that the apparent electrical angle, which corresponds to the rotational position of the pointer 20, coincides with the zero point θ0, on the assumption of the loss of synchronization of the step motor M, the electrical angle changes to the continuation end point θe (t4 to t6). As a consequence, when the loss of synchronization actually has been caused as illustrated in FIG. 12, the pointer 20 rotates to the position corresponding to the electrical angle whose phase is shifted from the actual controlled electrical angle by 360 degrees (t6), and when the loss of synchronization has not been caused as illustrated in FIG. 13, the pointer 20 rotates to the above-described corresponding position (t6) after the rotation (t5) of the pointer 20 due to the forcible synchronization loss. Thus, the continuation of the zero-reset control sub-processing is ended in a state in which the pointer 20 has rotated to the position corresponding to the zero point θ0.

When the correction control sub-processing is started after the above-described procedures, as illustrated in FIGS. 12 and 13, after the electrical angle temporarily becomes larger than the correction point θc, whose phase is shifted by 360 degrees from the reference point θb as a result of the shift of the phase of the correction point θc by 450 degrees from the continuation end point θe based on the zero point θ0, the electrical angle returns back to this correction point θc. Accordingly, the pointer 20 rotates to the zero position, and the initial processing is ended after the electrical angle of the reference point θb is read as the correction point θc (t6 to t7).

As is noted from the above description, in the present embodiment, the electrical angle, whose phase is shifted on the opposite side of the zero point θ0 from the detecting point θd following the zero point θ0 in the zero-reset control sub-processing, is set at the starting point θs of the zero-reset control sub-processing. For that reason, there is concern that an abnormal state in which the zero-reset control sub-processing is continued to the next detecting point θd to the zero point θ0 without reducing the speed of the pointer 20 that has rotated to the stopper position may arise. In such an abnormal state, the step motor M spontaneously loses synchronization easily. Nevertheless, by the continuation of the zero-reset control sub-processing on the assumption of the loss of synchronization of the step motor M, the pointer 20 is rotated to the position corresponding to the zero point θ0. Accordingly, in the correction control sub-processing based on the zero point θ0 after the zero-reset control sub-processing, the rotational position of the pointer 20 is set accurately at the zero position, and accurate rotation control of the pointer 20 is carried out in the subsequent normal processing as well.

Second Embodiment

A second embodiment of the invention will be described below with reference to the accompanying drawings. An indicating instrument 1 for a vehicle according to the second embodiment is disposed in front of a driver seat inside the vehicle as a vehicle speed meter. A structure of the indicating instrument 1 of the second embodiment is similar to that of the first embodiment. Therefore, detailed explanation of the structure of the indicating instrument 1 is omitted in the following description (see FIGS. 1 to 7).

Figure 14:
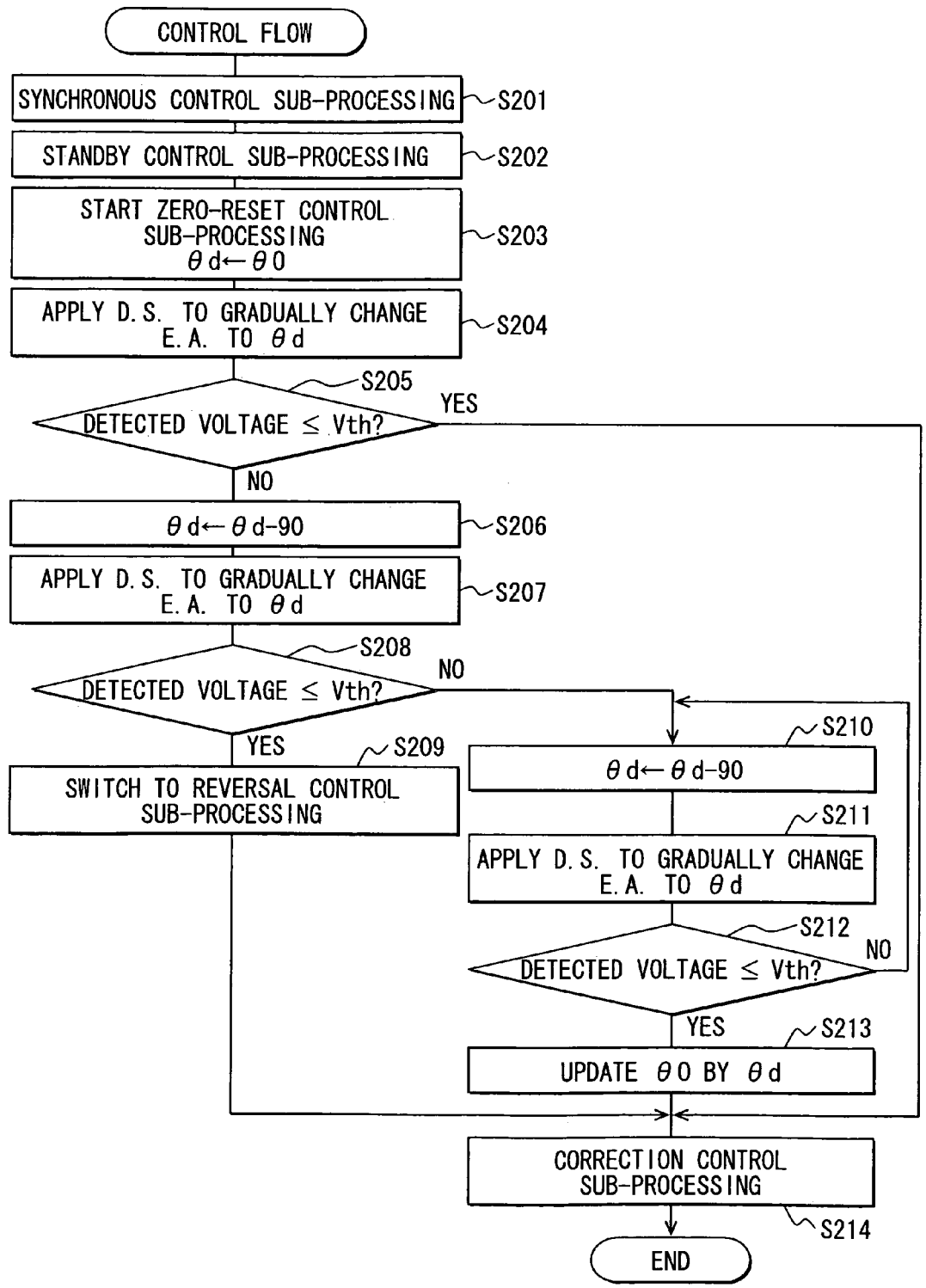
FIG. 14 is a flow chart illustrating a control flow of the indicating instrument according to the second embodiment.

A control flow for performing the initial processing by the control unit 50 in accordance with the second embodiment will be described in detail below with reference to FIG. 14. This control flow is started upon the start of the control unit 50.

At S201 of the control flow, synchronous control sub-processing is performed. More specifically, in the synchronous control sub-processing, the zero point θ0 and the phase interval ΔP that are stored in the memory 52 are first retrieved. Next, the electrical angle that is shifted from the zero point θ0 in the direction corresponding to the speed increasing direction Y by the phase interval ΔP, i.e., the electrical angle corresponding to the zero position of the pointer 20, is set at a reference point θb. Then, as the A-phase and B-phase drive signals, signals corresponding to the reference point θb are applied to the A-phase and B-phase field windings 32, 33. Furthermore, signals for synchronizing the magnetic poles of the magnet rotor Mr and the electrical angle by the rotation of the pointer 20 in the zero-reset direction X are applied to the A-phase and B-phase field windings 32, 33, as the A-phase and B-phase drive signals. Lastly, as the A-phase and B-phase drive signals, signals for returning the electrical angle back to the reference point θb are applied to the A-phase and B-phase field windings 32, 33.

At S202 that follows S201, standby control sub-processing is performed. More specifically, in the standby control sub-processing, signals for making the pointer 20 stand by at a predetermined starting point θs after gradual change of the electrical angle from the reference point θb, which is set by the synchronous control sub-processing at S201, to the starting point θs, are applied to the A-phase and B-phase field windings 32, 33 as the A-phase and B-phase drive signals. The starting point θs may be set at such a small value as to limit unattractiveness of the indicating instrument 1 because of upward swing and downward swing of the pointer 20 in the standby control sub-processing, and furthermore, at such a large value as to detect the induced voltage in zero-reset control sub-processing, which is described in greater detail hereinafter. For these reasons, in the present embodiment, for instance, the starting point θs is set at the electrical angle whose phase is shifted from the zero point θ0 by 273 degrees in the direction corresponding to the speed increasing direction Y.

At S203 that follows, the zero-reset control sub-processing that mainly includes rotation control of the pointer 20 in the zero-reset direction X is started. The zero point θ0, which is stored in the memory 52, is retrieved, and this zero point θ0, which is located further in the direction corresponding to the zero-reset direction X than the starting point θs, is set at the present detecting point θd. At S204, signals for gradually changing the electrical angle to the detecting point θd, which is set at S203, are applied to the A-phase and B-phase field windings 32, 33 as the A-phase and B-phase drive signals. At S205, induced voltage of a detection winding of the A-phase and B-phase field windings 32, 33 whose drive signal has zero of voltage at the present detecting point θd is detected, and whether this detected voltage is equal to or smaller than a set value Vth is determined.

If a negative determination is made at S205 as a result of the detected voltage being larger than the set value Vth, control proceeds to S206. At S206, an electrical angle whose phase is shifted from the detecting point θd, which is set at S203, by 90 degrees in the direction corresponding to the zero-reset direction X, is set at the present detecting point θd. Accordingly, at S206, the next detecting point θd is set at the zero point θ0, which has been set at the detecting point θd at S203. At S207, signals for gradually changing the electrical angle to the detecting point θd, which is set at S206, are applied to the A-phase and B-phase field windings 32, 33 as the A-phase and B-phase drive signals. At S208, according as S205, induced voltage of a detection winding is detected, and whether this detected voltage is equal to or smaller than a set value Vth is determined.

If a positive determination is made at S208 as a result of the detected voltage being equal to or smaller than the set value Vth, control proceeds to S209. At S209, control switches to reversal control sub-processing to reverse a direction of rotation of the pointer 20 from the zero-reset direction X in the zero-reset control sub-processing into the speed increasing direction Y. More specifically, in the reversal control sub-processing, at S206, the A-phase and B-phase drive signals are applied to the A-phase and B-phase field windings 32, 33 in a manner such that the electrical angle is changed stepwise from the detecting point θd, which is set following the zero point θ0, toward this zero point θ0. By the continuation of such reversal control sub-processing until the electrical angle returns to the zero point θ0, the loss of synchronization of the step motor M is avoided.

Thus far, the case in which the positive determination is made at S208 has been described. If the negative determination is made at S208 as a result of the detected voltage being larger than the set value Vth, control proceeds to S210. At S210, the electrical angle whose phase is shifted from the detecting point θd (that is set at S206 immediately before S210, or at S210, after which control returns to the present step S210 through S212) by 90 degrees in the direction corresponding to the zero-reset direction X, is set at the present detecting point θd. At S211, signals for gradually changing the electrical angle to the detecting point θd, which is set at S210, are applied to the A-phase and B-phase field windings 32, 33 as the A-phase and B-phase drive signals. At S212, according as S205, induced voltage of a detection winding is detected, and whether this detected voltage is equal to or smaller than a set value Vth is determined.

As long as a negative determination is made at S212, control returns to S210, and the procedures at S210 and the following steps S211, S212 are repeated. If a positive determination is made at S212, control proceeds to S213. At S213, it is determined that the detecting point θd, which is set at the immediately preceding step S210, is the present zero point θ0 corresponding to the stopper position of the pointer 20, and accordingly, the zero point θ0, which is stored in the memory 52, is updated by this detecting point θd.

Upon completion of S209, S213, which branch out from S208, or if a positive determination is made at S205 as a result of the detected voltage being equal to or smaller than the set value Vth, control proceeds to S214 to perform correction control sub-processing. More specifically, in the correction control sub-processing, the latest zero point θ0, which is stored in the memory 52, is first retrieved, then the reference point θb based on this zero point θ0 is set in accordance with the step S201. Next, the A-phase and B-phase drive signals are applied to the A-phase and B-phase field windings 32, 33 in a manner such that the electrical angle, which is temporarily made larger than this set reference point θb, is gradually changed to the reference point θb. Accordingly, the rotational position of the pointer 20 is set at the zero position corresponding to the reference point θb. Through the above-described procedures, the present initial processing is completed, and the following normal processing is started.

Figure 15:
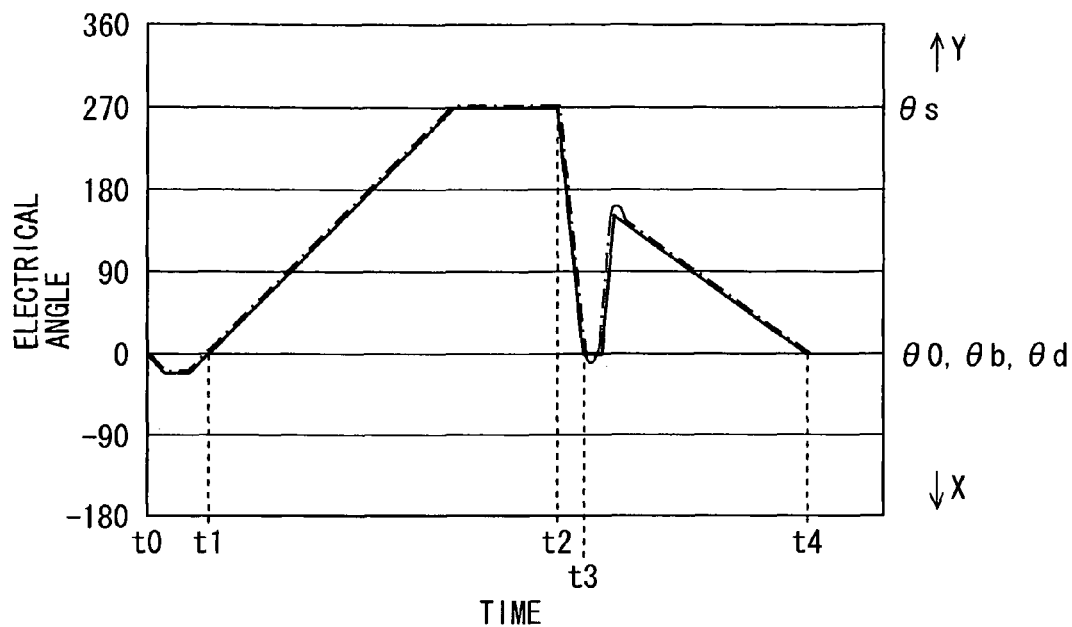
FIG. 15 is a characteristic diagram illustrating a fourth exemplary operation of the indicating instrument according to the second embodiment.
Figure 16:
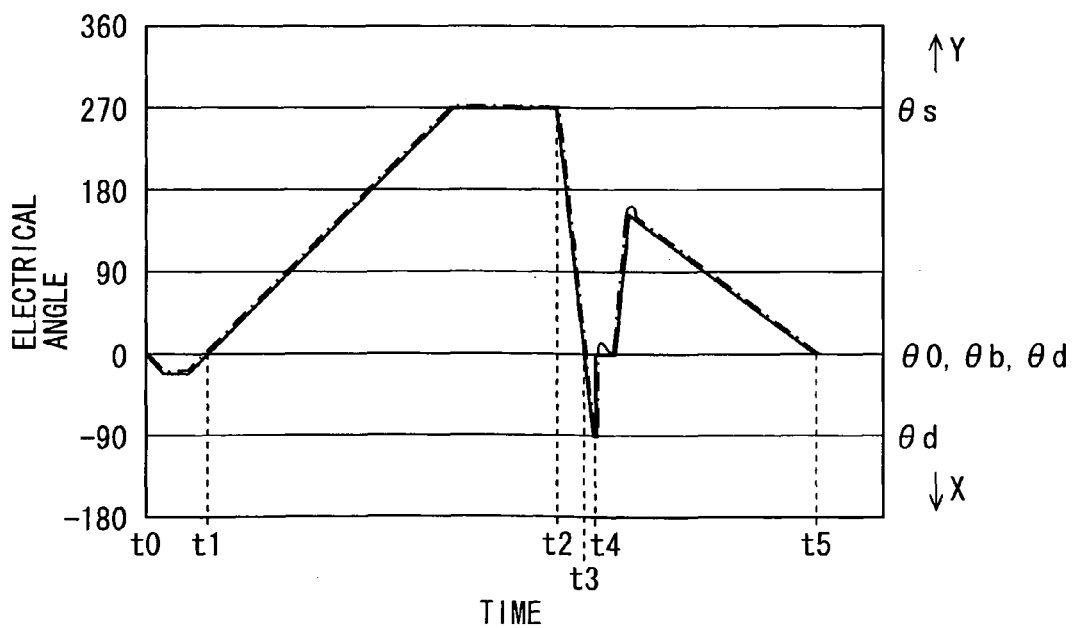
FIG. 16 is a characteristic diagram illustrating a fifth exemplary operation of the indicating instrument according to the second embodiment.
Figure 17:
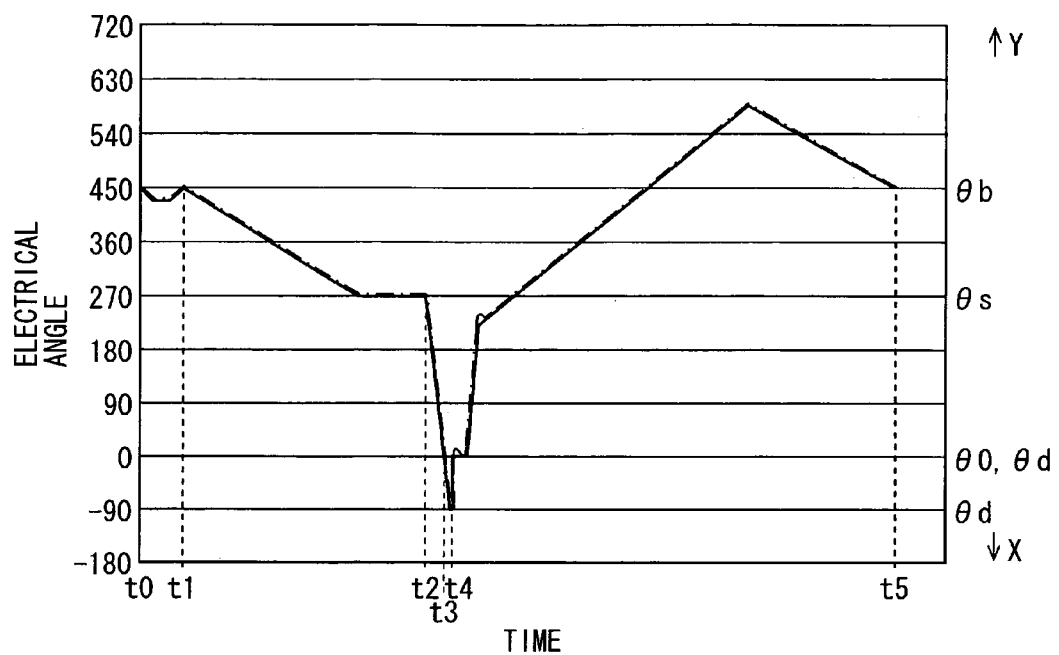
FIG. 17 is a characteristic diagram illustrating a sixth exemplary operation of the indicating instrument according to the second embodiment.

Exemplary operations realized by the above-described initial processing will be described below with reference to FIGS. 15 to 17. In graphs of FIGS. 15 to 17, a continuous line indicates a change of the electrical angle with time, and an alternate long and short dash line indicates a change of the rotational position of the pointer 20 with time using its corresponding temporal change in the electrical angle.

A fourth exemplary operation will be explained below. FIG. 15 illustrates an example of normal time when the induced voltage is properly detected at the zero point θ0 under conditions in which the phase interval ΔP between the electrical angle corresponding to the zero position of the pointer 20 and the zero point θ0 corresponding to the stopper position is 0 (zero) degree and in which the pointer 20 is not shifted from the zero position of the pointer 20 before the start of the control unit 50.

When the initial processing is started upon the start of the control unit 50, after the electrical angle changes to the reference point θb, which coincides with the zero point θ0, so that the rotational position of the pointer 20 is set at the zero position, the magnet rotor Mr and the electrical angle are synchronized and the pointer 20 is returned to this zero position (t0 to t1), by the synchronous control sub-processing. Then, by the standby control sub-processing, the electrical angle changes to the starting point θs whose phase is shifted from the zero point θ0 by 273 degrees in the direction corresponding to the speed increasing direction Y, so that the pointer 20 is swung up to a position corresponding to the starting point θs (t1 to t2).

Next, upon the start of the zero-reset control sub-processing, the electrical angle changes to the first detecting point θd that coincides with the zero point θ0, so that the pointer 20 stops at the stopper position. Accordingly, the detected voltage of the induced voltage of the detection winding 33 is equal to or smaller than the set value Vth at the normal time (t2 to t3).

The correction control sub-processing is started after the above-described procedures. Consequently, the electrical angle temporarily becomes larger than the reference point θb, which coincides with the zero point θ0, and then returns back to this reference point θb. In consequence, the pointer 20 rotates to the zero position, and the initial processing is ended (t3 to t4).

A fifth exemplary operation will be explained below. FIG. 16 illustrate an example of the time of abnormal detection when the induced voltage is not properly detected at the zero point θ0 under conditions in which the phase interval ΔP is 0 (zero) degree and the pointer 20 is not shifted from the zero position of the pointer 20 before the start of the control unit 50.

When the initial processing is started upon the start of the control unit 50, similar to the fourth exemplary operation, the synchronous control sub-processing and the standby control sub-processing are performed in this order (t0 to t2).

Next, upon the start of the zero-reset control sub-processing, the electrical angle changes to the first detecting point θd that coincides with the zero point θ0, so that the pointer 20 stops at the stopper position. At the abnormal time, however, the detected voltage of the induced voltage of the detection winding 33 becomes larger than the set value Vth, so that the zero-reset control sub-processing is continued (t2 to t3). As a result, the electrical angle reaches the next detecting point θd whose phase is shifted from the zero point θ0 by 90 degrees in the direction corresponding to the zero-reset direction X. Accordingly, the detected voltage of the induced voltage of the detection winding 32 becomes equal to or smaller than the set value Vth (t3 to t4).

In such a case of the abnormal detection, as a result of the switch from the zero-reset control sub-processing to the reversal control sub-processing, the electrical angle changes in a stepwise fashion toward the zero point θ0 to immediately reach the zero point θ0 (t4). As a result, the pointer 20 rotates to a position corresponding to the zero point θ0 (zero position in the present example), and the reversal control sub-processing is ended at this rotational position.

The correction control sub-processing is started after the above-described procedures. Consequently, the electrical angle temporarily becomes larger than the reference point θb, which coincides with the zero point θ0 that the electrical angle has reached at the completion of the reversal control sub-processing, and then the electrical angle returns back to this reference point θb. In consequence, the pointer 20 rotates to the zero position, and the initial processing is ended (t4 to t5).

A sixth exemplary operation will be explained below. FIG. 17 illustrates an example of the time of abnormal detection when the induced voltage is not properly detected at the zero point θ0 under conditions in which the phase interval ΔP is 450 degrees and the pointer 20 is not shifted from the zero position of the pointer 20 before the start of the control unit 50.

When the initial processing is started upon the start of the control unit 50, by the synchronous control sub-processing, the electrical angle changes to the reference point θb whose phase is shifted from the zero point θ0 by 450 degrees in the direction corresponding to the speed increasing direction Y, so that the rotational position of the pointer 20 is set at the zero position. After that, the magnet rotor Mr and the electrical angle are synchronized and the pointer 20 is returned to this zero position (t0 to t1). Then, by the standby control sub-processing, the electrical angle changes to the starting point θs whose phase is shifted from the zero point θ0 by 273 degrees in the direction corresponding to the speed increasing direction Y, so that the pointer 20 is swung down to a position corresponding to this starting point θs (t1 to t2).

Next, similar to the fifth exemplary operation, the zero-reset control sub-processing is continued to the next detecting point θd of the zero point θ0 because of the abnormality. The detected voltage of the induced voltage of the detection winding 32 becomes equal to or smaller than the set value Vth at the above next detecting point θd (t2 to t4). In this case as well, similar to the fifth exemplary operation, as a result of the switch from the zero-reset control sub-processing to the reversal control sub-processing, the electrical angle changes in a stepwise fashion toward the zero point θ0 to immediately reach the zero point θ0 (t4). As a result, the pointer 20 rotates to the position corresponding to the zero point θ0, and the reversal control sub-processing is ended at this rotational position.

The correction control sub-processing is started after the above-described procedures. Consequently, the electrical angle temporarily becomes larger than the reference point θb whose phase is shifted by 450 degrees from the zero point θ0 that the electrical angle has reached at the completion of the reversal control sub-processing, and then the electrical angle returns back to this reference point θb. In consequence, the pointer 20 rotates to the zero position, and the initial processing is ended (t4 to t5).

As is appreciated from the above description, in the present embodiment, the electrical angle, whose phase is shifted on the opposite side of the zero point θ0 from the detecting point θd next to the zero point θ0 in the zero-reset control sub-processing, is set at the starting point θs of the zero-reset control sub-processing. For that reason, there is concern that an abnormal state may arise in which the zero-reset control sub-processing is continued to the detecting point θd next to the zero point θ0 without reducing the speed of the pointer 20 that has rotated to the stopper position In such an abnormal state, the step motor M spontaneously loses synchronization easily. Nevertheless, the pointer 20 rotates promptly to the position corresponding to the zero point θ0 in the speed increasing direction Y as a result of the switch to the reversal control sub-processing to control the electrical angle to the zero point θ0. Therefore, this loss of synchronization of the step motor M is avoided. Accordingly, in the correction control sub-processing based on the zero point θ0 after the reversal control sub-processing, the rotational position of the pointer 20 is set accurately at the zero position, and accurate rotation control of the pointer 20 is carried out in the subsequent normal processing as well.

The first embodiment of the invention is summarized as follows. An indicating instrument for a vehicle includes a step motor M, a pointer 20, a stopper device S, a detecting device 50, and a control device 50. The step motor M includes a field winding 32, 33 and is rotated upon application of a drive signal to the field winding 32, 33. The drive signal is an alternating current that alternates in accordance with an electrical angle. The pointer 20 is rotatable in synchronization with the step motor M. The pointer 20 points to a vehicle state value, which is indicated with a zero value as a reference thereof, in accordance with a rotational position of the pointer 20. The pointer 20 is rotatable in a zero-reset direction X to return to a zero position that indicates the zero value. The stopper device S stops the pointer 20, which is rotating in the zero-reset direction X, at a stopper position that is located within a predetermined range from the zero position in the zero-reset direction X. The detecting device 50 detects an induced voltage generated in the field winding 32, 33 at each of a plurality of detecting points θ0, θd, which are electrical angles at intervals of 90 degrees and include a zero point θ0 that corresponds to the stopper position. The control device 50 performs zero-reset control, whereby the control device 50 controls the drive signal so as to rotate the pointer 20 in the zero-reset direction X. In a state of abnormal detection in which: the detecting device 50 detects the induced voltage that is larger than a predetermined set value Vth at the zero point θ0; and the detecting device 50 detects the induced voltage that is equal to or smaller than the set value Vth at a next detecting point θd to the zero point θ0, the control device 50 assumes loss of synchronization of the step motor M and continues the zero-reset control until an assumptive electrical angle that corresponds to a rotational position of the pointer 20 reaches the zero point θ0.

By the zero-reset control for rotating the pointer 20 in the zero-reset direction X through the control of drive signals applied to the field windings 32, 33 of the step motor M, the pointer 20 is stopped at the stopper position located within a predetermined range from the zero position in the zero-reset direction X. By such zero-reset control, the following abnormal detection is a concern. Specifically, the induced voltage that is larger than the set value Vth may be detected at the zero point θ0 (electrical angle) which is set corresponding to the stopper position, and furthermore the induced voltage that is equal to or smaller than the set value Vth may be detected at the next detecting point θd to the zero point θ0, i.e., at the electrical angle whose phase is shifted from the zero point θ0 by 90 degrees.

Accordingly, in the first embodiment, in the case of the above-described abnormal detection, the zero-reset control is continued on the assumption that the step motor M has lost synchronization. The continuation of the zero-reset control is realized until the apparent electrical angle, which corresponds to the rotational position of the pointer 20, reaches the zero point θ0 on the assumption of the loss of synchronization of the step motor M. Therefore, even if the step motor M loses synchronization as a result of the electrical angle advancing to the next detecting point θd to the zero point θ0, the pointer 20 that has rotated to the position corresponding to the electrical angle whose phase is shifted by 360 degrees from the actual electrical angle, is rotated further to the position corresponding to the zero point θ0 by the continuation of the zero-reset control. On the other hand, if the step motor M does not lose synchronization even though the electrical angle advances to the next detecting point θd to the zero point θ0, the step motor M is forced to lose synchronization by the continuation of the zero-reset control, so that the pointer 20 is rotated to the position corresponding to the electrical angle whose phase is shifted by 360 degrees from the electrical angle at the time of this forcible synchronization loss. In addition, after the forcible synchronization loss, the pointer 20 is rotated to the position corresponding to the zero point θ0 by the continuation of the zero-reset control. As a consequence, based on the zero point θ0 which apparently corresponds to the rotational position of the pointer 20 at the completion of the continuation of the zero-reset control, rotation control of the pointer 20 through the drive signals in accordance with the electrical angle is accurately carried out.

In the state of abnormal detection, the control device 50 may continue the zero-reset control until a continuation end electrical angle θe, a phase of which is shifted from the zero point θ0 by 360 degrees.

By the continuation of the zero-reset control in this manner in the case of the abnormal detection, the actual electrical angle changes to the electrical angle whose phase is shifted from the zero point θ0 by 360 degrees. Therefore, whether in the case of the loss of synchronization of the step motor M as a result of the electrical angle advancing to the next detecting point θd to the zero point θ0 or in the case of the forcible synchronization loss of the step motor M by the continuation of the zero-reset control, the pointer 20 that has rotated to the position corresponding to the electrical angle whose phase is shifted from the actual electrical angle by 360 degrees, is reliably rotated to the position corresponding to the zero point θ0. As a result, the accurate rotation control of the pointer 20 is consolidated to enhance reliability of the indicating instrument 1 for a vehicle.

The indicating instrument of the first embodiment may further include a storing device 52 for storing a phase interval ΔP between a reference electrical angle θb that corresponds to the zero position and the zero point θ0. After completion of continuation of the zero-reset control associated with the state of abnormal detection, the control device 50 may control the drive signal to a correction electrical angle θc that is shifted by the phase interval ΔP from the continuation end electrical angle θe at the completion of the continuation of the zero-reset control.

As a result of the control of the drive signals in this manner after the completion of the continuation of the zero-reset control in accordance with the abnormal detection, the electrical angle whose phase is shifted from the electrical angle θe (phase of the electrical angle θe is shifted from the zero point θ0 by 360 degrees at the completion of the continuation of the zero-reset control) by the phase interval stored in the storing device, i.e., the electrical angle whose phase is shifted by 360 degrees from the electrical angle θb corresponding to the zero position, is reached. Thus, whether in the case of the loss of synchronization as a result of the electrical angle advancing to the next detecting point θd to the zero point θ0 or in the case of the forcible synchronization loss by the continuation of the zero-reset control, the rotational position of the pointer 20 after the pointer 20 has rotated to the position corresponding to the zero point θ0, is set accurately at the zero position. Accordingly, inaccurate indication of the zero value by the pointer 20 at the zero position is avoided.

The control device 50 may start the zero-reset control from a starting electrical angle θs, a phase of which is shifted on an opposite side of the zero point θ0 from the next detecting point θd in the zero-reset control.

In this manner, in the zero-reset control that is started from the electrical angle, whose phase is shifted from the next detecting point θd to the zero point θ0 on the opposite side of the zero point θ0, because the speed of the pointer 20 that has rotated to the stopper position is not reduced, the electrical angle is easily advanced to the next detecting point θd whose phase is shifted by 90 degrees from the zero point θ0. However, at the time of the abnormal detection due to the advance of the electrical angle to the next detecting point θd whose phase is shifted by 90 degrees from the zero point θ0, the zero-reset control is continued until the apparent electrical angle, which corresponds to the rotational position of the pointer 20, reaches the zero point θ0 on the assumption of the loss of synchronization of the step motor M. Accordingly, the accurate rotation control of the pointer 20 is carried out.

The second embodiment of the invention is summarized as follows. An indicating instrument for a vehicle includes a step motor M, a pointer 20, a stopper device S, a detecting device 50, and a control device 50. The step motor M includes a field winding 32, 33 and is rotated upon application of a drive signal to the field winding 32, 33. The drive signal is an alternating current that alternates in accordance with an electrical angle. The pointer 20 is rotatable in synchronization with the step motor M. The pointer 20 points to a vehicle state value, which is indicated with a zero value as a reference thereof, in accordance with a rotational position of the pointer 20. The pointer 20 is rotatable in a zero-reset direction X to return to a zero position that indicates the zero value. The stopper device S stops the pointer 20, which is rotating in the zero-reset direction X, at a stopper position that is located within a predetermined range from the zero position in the zero-reset direction X. The detecting device 50 detects an induced voltage generated in the field winding 32, 33 at each of a plurality of detecting points $\theta 0$, $\theta d$, which are electrical angles at intervals of 90 degrees and include a zero point $\theta 0$ that corresponds to the stopper position. The control device 50 performs zero-reset control, whereby the control device 50 controls the drive signal so as to rotate the pointer 20 in the zero-reset direction X. In a state of abnormal detection in which the detecting device 50 detects the induced voltage that is larger than a predetermined set value Vth at the zero point $\theta 0$; and the detecting device 50 detects the induced voltage that is equal to or smaller than the set value Vth at a next detecting point $\theta d$ to the zero point $\theta 0$, the control device 50 switches from the zero-reset control to reversal control, whereby the control device 50 reverses a rotation direction of the pointer 20 from the zero-reset direction X, by controlling the drive signal to the zero point $\theta 0$.

By the zero-reset control for rotating the pointer 20 in the zero-reset direction X through the control of drive signals applied to the field windings 32, 33 of the step motor M, the pointer 20 is stopped at the stopper position located within a predetermined range from the zero position in the zero-reset direction X. By such zero-reset control, the following abnormal detection is a concern. Specifically, the induced voltage that is larger than the set value Vth may be detected at the zero point $\theta 0$ (electrical angle) which is set corresponding to the stopper position, and furthermore the induced voltage that is equal to or smaller than the set value Vth may be detected at the next detecting point $\theta d$ to the zero point $\theta 0$, i.e., at the electrical angle whose phase is shifted from the zero point $\theta 0$ by 90 degrees.

Accordingly, in the second embodiment, at the time of the abnormal detection when the induced voltage at the zero point $\theta 0$ that is larger than the set value Vth, and the induced voltage at the next detecting point $\theta d$ to the zero point $\theta 0$ that is equal to or smaller than the set value Vth are detected by the zero-reset control, control switches to the reversal control to reverse the rotational direction of the pointer 20 from the zero-reset direction X through the control of the drive signals to the zero point $\theta 0$. As a result of such switch into the reversal control, the electrical angle that has advanced to the next detecting point $\theta d$ to the zero point $\theta 0$ by the zero-reset control is returned to the zero point $\theta 0$, so that the loss of synchronization of the step motor M is avoided. Therefore, after completion of the reversal control, rotation control of the pointer 20 through the drive signals in accordance with the electrical angle is accurately carried out based on the zero point $\theta 0$ which corresponds to the rotational position of the pointer 20 at the completion of the reversal control.

By the reversal control, the control device 50 may change the electrical angle from the next detecting point $\theta d$ in the zero-reset control toward the zero point $\theta 0$ in a stepwise fashion.

As above, as a result of the reversal control to change the electrical angle in a stepwise fashion from the next detecting point $\theta d$ to the zero point $\theta 0$ in the zero-reset control toward the zero point $\theta 0$, the electrical angle that has advanced to the next detecting point $\theta d$ to the zero point $\theta 0$ by the zero-reset control is returned immediately to the zero point $\theta 0$, so that the loss of synchronization of the step motor M is reliably avoided. As a result, the accurate rotation control of the pointer 20 is consolidated to enhance reliability of the indicating instrument 1 for a vehicle.

The indicating instrument of the second embodiment may further include a storing device 52 for storing a phase interval $\Delta P$ between a reference electrical angle $\theta b$ that corresponds to the zero position and the zero point $\theta 0$. After completion of the reversal control associated with the state of abnormal detection, the control device 50 may control the drive signal to the reference electrical angle $\theta b$, which is shifted by the phase interval $\Delta P$ from the zero point $\theta 0$ at the completion of the reversal control.

As a result of the control of the drive signals in this manner after the completion of the reversal control in accordance with the abnormal detection, the electrical angle whose phase is shifted from the zero point $\theta 0$ at the completion of the reversal control by the phase interval stored in the storing device, i.e., the electrical angle $\theta b$ corresponding to the zero position, is reached. Thus, the rotational position of the pointer 20 after the pointer 20 has been returned to the position corresponding to the zero point $\theta 0$ by the reversal control, is set accurately at the zero position. Accordingly, inaccurate indication of the zero value by the pointer 20 at the zero position is avoided.

The control device 50 may start the zero-reset control from a starting electrical angle $\theta s$, a phase of which is shifted on an opposite side of the zero point $\theta 0$ from the next detecting point $\theta d$ in the zero-reset control.

In this manner, in the zero-reset control that is started from the electrical angle, whose phase is shifted from the next detecting point $\theta d$ to the zero point $\theta 0$ on the opposite side of the zero point $\theta 0$, because the speed of the pointer 20 that has rotated to the stopper position is not reduced, the electrical angle is easily advanced to the next detecting point $\theta d$ whose phase is shifted by 90 degrees from the zero point $\theta 0$. However, at the time of the abnormal detection due to the advance of the electrical angle to the next detecting point $\theta d$ whose phase is shifted by 90 degrees from the point $\theta 0$, control switches from the zero-reset control to the reversal control to reverse the rotational direction of the pointer 20 from the zero-reset direction X through the control of the drive signals to the zero point $\theta 0$. Accordingly, the accurate rotation control of the pointer 20 is carried out.

Modifications of the embodiments will be described below. The embodiments of the invention are described above. Nevertheless, the invention is not interpreted by limiting itself to the above-described embodiments, and may be applied to various embodiments without departing from the scope of the invention.

Specifically, a device for directly engaging and stopping the pointer 20 may be employed as the "stopper device." Furthermore, as regards the A-phase and B-phase drive signals, as long as they are signals that alternate with a phase difference of 90 degrees between each other, the A-phase and B-phase drive signals may be signals other than those whose voltages change in the shape of a cosine function or sine function, e.g., signals that change in the shape of a trapezoidal wave or triangular wave. In addition, in respect to the vehicle state value indicated by the pointer 20, as long as it is a value related to various states of the vehicle, the vehicle state value may be a fuel remaining amount, coolant temperature, or an engine rotation speed, for example. Lastly, in the control flow of the first embodiment, at least one of the synchronous control sub-processing at S1 and the correction control sub-processing at S10, S15 need not be performed. In the control flow of the second embodiment, at least one of the synchronous control sub-processing at S201 and the correction control sub-processing at S214 does not need to be executed.

Additional advantages and modifications will readily occur to those skilled in the art. The invention in its broader terms is therefore not limited to the specific details, representative apparatus, and illustrative examples shown and described.

What is claimed is:

1. An indicating instrument for a vehicle comprising:
    a step motor that includes a field winding and is rotated upon application of a drive signal to the field winding, wherein the drive signal is an alternating current that alternates in accordance with an electrical angle;
    a pointer that is rotatable in synchronization with the step motor, wherein:
        the pointer points to a vehicle state value, which is indicated with a zero value as a reference thereof, in accordance with a rotational position of the pointer; and
        the pointer is rotatable in a zero-reset direction to return to a zero position that indicates the zero value;
    a stopper device for stopping the pointer, which is rotating in the zero-reset direction, at a stopper position that is located within a predetermined range from the zero position in the zero-reset direction;
    a detecting device for detecting an induced voltage generated in the field winding at each of a plurality of detecting points, which are electrical angles at intervals of 90 degrees and include a zero point that corresponds to the stopper position; and
    a control device for performing zero-reset control, whereby the control device controls the drive signal so as to rotate the pointer in the zero-reset direction, wherein in a state of abnormal detection in which:
        the detecting device detects the induced voltage that is larger than a predetermined set value at the zero point; and
        the detecting device detects the induced voltage that is equal to or smaller than the set value at a next detecting point to the zero point,
    the control device assumes loss of synchronization of the step motor and continues the zero-reset control until an assumptive electrical angle that corresponds to a rotational position of the pointer reaches the zero point.

2. The indicating instrument according to claim 1, wherein in the state of abnormal detection, the control device continues the zero-reset control until a continuation end electrical angle, a phase of which is shifted from the zero point by 360 degrees.

3. The indicating instrument according to claim 2, further comprising a storing device for storing a phase interval between a reference electrical angle that corresponds to the zero position and the zero point, wherein after completion of continuation of the zero-reset control associated with the state of abnormal detection, the control device controls the drive signal to a correction electrical angle that is shifted by the phase interval from the continuation end electrical angle at the completion of the continuation of the zero-reset control.

4. The indicating instrument according to claim 1, wherein the control device starts the zero-reset control from a starting electrical angle, a phase of which is shifted on an opposite side of the zero point from the next detecting point in the zero-reset control.

5. An indicating instrument for a vehicle comprising:
    a step motor that includes a field winding and is rotated upon application of a drive signal to the field winding, wherein the drive signal is an alternating current that alternates in accordance with an electrical angle;
    a pointer that is rotatable in synchronization with the step motor, wherein:
        the pointer points to a vehicle state value, which is indicated with a zero value as a reference thereof, in accordance with a rotational position of the pointer; and
        the pointer is rotatable in a zero-reset direction to return to a zero position that indicates the zero value;
    a stopper device for stopping the pointer, which is rotating in the zero-reset direction, at a stopper position that is located within a predetermined range from the zero position in the zero-reset direction;
    a detecting device for detecting an induced voltage generated in the field winding at each of a plurality of detecting points, which are electrical angles at intervals of 90 degrees and include a zero point that corresponds to the stopper position; and
    a control device for performing zero-reset control, whereby the control device controls the drive signal so as to rotate the pointer in the zero-reset direction, wherein in a state of abnormal detection in which:
        the detecting device detects the induced voltage that is larger than a predetermined set value at the zero point; and
        the detecting device detects the induced voltage that is equal to or smaller than the set value at a next detecting point to the zero point,
    the control device switches from the zero-reset control to reversal control, whereby the control device reverses a rotation direction of the pointer from the zero-reset direction, by controlling the drive signal to the zero point.

6. The indicating instrument according to claim 5, wherein by the reversal control, the control device changes the electrical angle from the next detecting point in the zero-reset control toward the zero point in a stepwise fashion.

7. The indicating instrument according to claim 5, further comprising a storing device for storing a phase interval between a reference electrical angle that corresponds to the zero position and the zero point, wherein after completion of the reversal control associated with the state of abnormal detection, the control device controls the drive signal to the reference electrical angle, which is shifted by the phase interval from the zero point at the completion of the reversal control.

8. The indicating instrument according to claim 5, wherein the control device starts the zero-reset control from a starting electrical angle, a phase of which is shifted on an opposite side of the zero point from the next detecting point in the zero-reset control.

* * * * *